(12) United States Patent
Oh et al.

(10) Patent No.: US 10,290,685 B2
(45) Date of Patent: May 14, 2019

(54) DISPLAY DEVICE

(71) Applicant: Samsung Display Co., Ltd., Yongin-si, Gyeonggi-do (KR)

(72) Inventors: Hyunjoon Oh, Seongnam-si (KR); Byunghoon Kang, Gwangju-si (KR); Boa Kim, Icheon-si (KR); Sanghoon Kim, Hwaseong-si (KR); Sang-il Park, Yongin-si (KR); Heonjung Shin, Hwaseong-si (KR); Hye-jin Oh, Asan-si (KR); Jeongsub Lee, Seoul (KR); Junhyuk Cheon, Seoul (KR); Min-hoon Choi, Seoul (KR)

(73) Assignee: Samsung Display Co., Ltd., Yongin-si (KR)

(*) Notice: Subject to any disclaimer, the term of this patent is extended or adjusted under 35 U.S.C. 154(b) by 83 days.

(21) Appl. No.: 15/356,293

(22) Filed: Nov. 18, 2016

(65) Prior Publication Data

US 2017/0338286 A1 Nov. 23, 2017

(30) Foreign Application Priority Data

May 23, 2016 (KR) ........................ 10-2016-0063017

(51) Int. Cl.
*H01L 27/32* (2006.01)
*H01L 51/52* (2006.01)
(Continued)

(52) U.S. Cl.
CPC .......... *H01L 27/323* (2013.01); *G06F 3/0412* (2013.01); *H01L 27/3244* (2013.01);
(Continued)

(58) Field of Classification Search
CPC ............. H01L 27/3262; H01L 27/3276; H01L 27/3246; H01L 27/3258; H01L 27/3248;
(Continued)

(56) References Cited

U.S. PATENT DOCUMENTS

| | | | |
|---|---|---|---|
| 8,243,424 B1 * | 8/2012 | Babu ..................... | G06F 1/1601 361/679.01 |
| 2005/0110785 A1 | 5/2005 | Ochiai et al. | |

(Continued)

FOREIGN PATENT DOCUMENTS

| | | |
|---|---|---|
| JP | 2015-053055 A | 3/2015 |
| KR | 10-2015-0009318 A | 1/2015 |

(Continued)

OTHER PUBLICATIONS

EPO Extended Search Report dated Oct. 27, 2017, for corresponding European Patent Application No. 17171466.0 (9 pages).

*Primary Examiner* — Koosha Sharifi-Tafreshi
(74) *Attorney, Agent, or Firm* — Lewis Roca Rothgerber Christie LLP

(57) ABSTRACT

A display device includes: a display panel layer including a display area and a second non-light emitting area, the display area including a plurality of light emitting areas and a first non-light emitting area, the first non-light emitting area being around each of the light emitting areas, and the second non-light emitting area being outside the display area; a window coating layer directly on a first surface of the display panel layer; and a first curl-preventing pattern overlapping at least one of the first non-light emitting area and the second non-light emitting area when viewed in a plan view and contacting the window coating layer. The first curl-preventing pattern is configured to prevent the window coating layer from curling.

24 Claims, 19 Drawing Sheets

(51) Int. Cl.
*G06F 3/041* (2006.01)
*G06F 3/044* (2006.01)
*G06F 3/046* (2006.01)

(52) U.S. Cl.
CPC ...... H01L 51/5246 (2013.01); H01L 51/5253 (2013.01); H01L 51/5281 (2013.01); H01L 51/5284 (2013.01); *G06F 3/044* (2013.01); *G06F 3/046* (2013.01); *H01L 2251/5338* (2013.01)

(58) Field of Classification Search
CPC ............... H01L 51/56; H01L 2227/323; H01L 51/5253; G09G 3/3233; G09G 2300/0426; G09G 3/3258; G06F 2203/04103
See application file for complete search history.

(56) References Cited

U.S. PATENT DOCUMENTS

| | | | |
|---|---|---|---|
| 2008/0055831 A1* | 3/2008 | Satoh | G02F 1/133305 361/600 |
| 2009/0302760 A1 | 12/2009 | Tchakarov et al. | |
| 2010/0033818 A1* | 2/2010 | Petcavich | B08B 17/06 359/507 |
| 2010/0039398 A1* | 2/2010 | Lin | G06F 1/1607 345/173 |
| 2011/0261513 A1* | 10/2011 | Tho | B29C 70/763 361/679.01 |
| 2014/0295150 A1 | 10/2014 | Bower et al. | |
| 2014/0308499 A1 | 10/2014 | Kim et al. | |
| 2015/0049428 A1* | 2/2015 | Lee | G06F 1/1652 361/679.27 |
| 2015/0093568 A1 | 4/2015 | Kim et al. | |
| 2015/0219942 A1 | 8/2015 | Lee | |
| 2015/0346550 A1* | 12/2015 | Wang | G02F 1/133528 349/57 |
| 2016/0109970 A1* | 4/2016 | Aurongzeb | G06F 1/1643 345/173 |

FOREIGN PATENT DOCUMENTS

| | | |
|---|---|---|
| KR | 10-2015-0057160 A | 5/2015 |
| KR | 10-1519422 B1 | 5/2015 |
| KR | 10-2015-0113305 A | 10/2015 |
| KR | 10-2016-0020615 A | 2/2016 |
| WO | WO 2008/009929 A2 | 1/2008 |
| WO | WO 2013/192311 A1 | 12/2013 |

* cited by examiner

DISPLAY DEVICE

CROSS-REFERENCE TO RELATED APPLICATION

This patent application claims priority to and the benefit of Korean Patent Application No. 10-2016-0063017, filed on May 23, 2016 in the Korean Intellectual Property Office, the content of which is hereby incorporated by reference in its entirety.

BACKGROUND

1. Field

Aspects of embodiments of the present disclosure relate to a display device.

2. Description of the Related Art

In recent years, interest in information displays has been high, and demand for portable information devices continues to increase. Accordingly, a flat panel display that is relatively light weight and thin has been intensively researched and commercialized to replace a cathode ray tube display.

In the field of flat panel displays, a liquid crystal display device has been in the spotlight because it has advantages of being relatively light weight and having relatively low power consumption, but the liquid crystal display device has disadvantages associated with brightness, contrast ratio, and viewing angle because the liquid crystal display device is not self-emissive. Research toward developing new display devices that overcome the disadvantages of the liquid crystal display device is being conducted.

Among the new display devices, an organic light emitting display device is a self-emissive display device, and thus, the organic light emitting display device has various advantages, such as superior viewing angle, superior contrast ratio, light weight, small thickness, low power consumption, low driving voltage, fast response speed, low manufacturing cost, etc., when compared with the liquid crystal display device because the organic light emitting display device does not need to include a backlight.

SUMMARY

Embodiments of the present disclosure provide a display device capable of preventing, reducing, or mitigating a curl phenomenon.

Embodiments of the inventive concept provide a display device including a display panel layer including a display area and a second non-light emitting area, the display area including a plurality of light emitting areas and a first non-light emitting area, the first non-light emitting area being around each of the light emitting areas, and the second non-light emitting area being outside the display area; a window coating layer directly on a first surface of the display panel layer; and a first curl-preventing pattern overlapping at least one of the first non-light emitting area and the second non-light emitting area when viewed in a plan view and contacting the window coating layer. The first curl-preventing pattern is configured to prevent the window coating layer from curling.

The second non-light emitting area may be around the display area when viewed in the plan view.

The first curl-preventing pattern may be on the first surface of the display panel layer.

The first curl-preventing pattern may be covered by the window coating layer.

The first curl-preventing pattern may have a closed-loop shape around the display area when viewed in the plan view.

The first curl-preventing pattern may overlap the first non-light emitting area.

The first curl-preventing pattern may have a lattice shape or a dot shape and may be spaced from the light emitting areas when viewed in the plan view.

The dot shape or the lattice shape may also overlap the second non-light emitting area.

The display device may be configured to be bent with respect to a bending axis, and the first curl-preventing pattern may not overlap the bending axis.

The display device may further include a base coating layer directly on a second surface of the display panel layer opposite the first surface of the display panel layer in a thickness direction of the display panel layer.

The display device may further include a second curl-preventing pattern overlapping at least one of the first non-light emitting area and the second non-light emitting area when viewed in the plan view and contacting the base coating layer. The second curl-preventing pattern may be configured to prevent the base coating layer from curling.

The second curl-preventing pattern may be on the second surface of the display panel layer.

The second curl-preventing pattern may be in the base coating layer.

The window coating layer may extend onto a side surface of the display panel layer. The base coating layer may extend onto the side surface of the display panel layer and may contact the window coating layer.

The window coating layer may be integrally formed with the base coating layer.

The display device may further include a protective layer on at least one of a side surface of the display panel layer, a side surface of the window coating layer, and a side surface of the base coating layer.

The display device may further include an accommodating chassis accommodating components to drive the display panel layer. An accommodating space may be defined between the accommodating chassis and at least one of a side surface of the display panel layer, a side surface of the window coating layer, and a side surface of the base coating layer, and the components may be accommodated in the accommodating space.

The first curl-preventing pattern may have an elastic modulus greater than an elastic modulus of the window coating layer.

The display panel layer may further include a pixel layer to display an image; a touch layer on the pixel layer and configured to sense a touch applied thereto; and a reflection-preventing layer on the pixel layer and configured to prevent external light from being reflected therefrom. One of the touch layer and the reflection-preventing layer may be an outermost layer of the display panel layer, and the window coating layer may be directly on an outer surface of the one of the touch layer and the reflection-preventing layer that is the outermost layer of the display panel layer.

Embodiments of the inventive concept provide a display device including: a display panel layer including a pixel layer to display an image, a touch layer on the pixel layer and configured to sense a touch applied thereto, and a reflection-preventing layer on the pixel layer and configured to prevent external light from being reflected therefrom; a window coating layer; and a curl-preventing pattern contacting the window coating layer. One of the touch layer and the reflection-preventing layer is an outermost layer of the display panel layer, and the window coating layer is directly on an outer surface of the one of the touch layer and the reflection-preventing layer that is the outermost layer of the display panel layer. The curl-preventing pattern is configured to prevent the window coating layer from curling.

Embodiments of the inventive concept provide a display device including: a display panel layer having a display area and a non-display area around the display area, the display panel layer including a plurality of organic light emitting diodes in the display area; a window coating layer on the display panel layer; and a curl-preventing pattern on the display panel layer in the display area between adjacent ones of the organic light emitting diodes. The curl-preventing pattern has a greater elastic modulus than the window coating layer.

The curl-preventing pattern may be on the display panel layer in the non-display area.

The display device may further include a black matrix on the display panel layer in the non-display area. The curl-preventing pattern may be on the black matrix and under the window coating layer.

The curl-preventing pattern may include a plurality of sub-curl preventing patterns. A first one of the sub-curl preventing patterns may extend from one edge of the display panel layer toward a center thereof, and a second one of the sub-curl preventing patterns may extend from another edge of the display panel layer opposite the one edge of the display panel layer. The first and second ones of the sub-curl preventing patterns may be spaced from each other.

The display device may be configured to be bent at an area between the first and second ones of the sub-curl preventing patterns.

According to the above, some embodiments of the display device include the curl-preventing pattern. Thus, the delamination or curl phenomenon may be prevented from occurring or may be mitigated when the display device is manufactured. In addition, the curl-preventing pattern is disposed to overlap the non-light emitting area, and thus, the curl-preventing pattern is not exposed to the outside (e.g., is not visible to a user) due to the black matrix.

BRIEF DESCRIPTION OF THE DRAWINGS

The above and other features and aspects of the present disclosure will become readily apparent by reference to the following detailed description when considered in conjunction with the accompanying drawings, in which.

DETAILED DESCRIPTION

Figure 1:
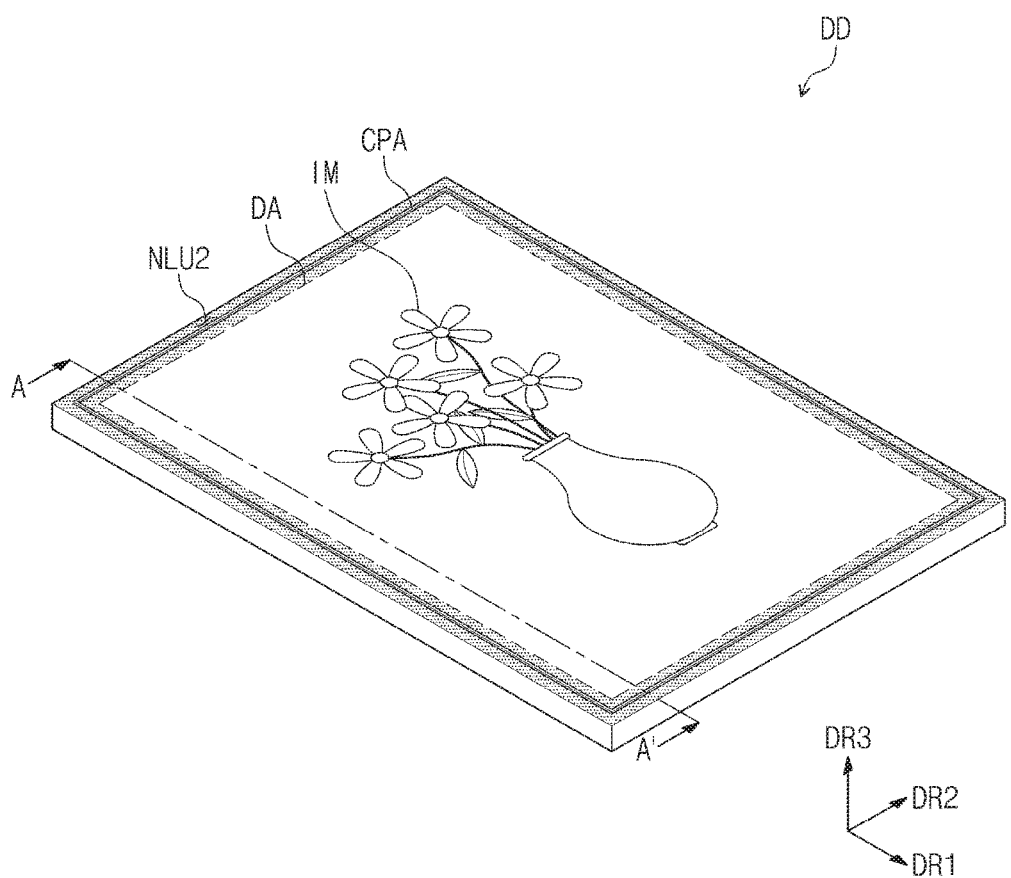
FIG. 1 is a perspective view of a display device according to an exemplary embodiment of the present disclosure.

The following description, with reference to the accompanying drawings, is provided to assist in a comprehensive understanding of the present disclosure as defined by the claims and their equivalents. The description includes various specific details to assist in that understanding, but the described embodiments, and the details therein, are to be regarded as merely exemplary. Accordingly, those of ordinary skill in the art will recognize that various changes and modifications of the various embodiments described herein may be made without departing from the scope and spirit of the present disclosure.

Like numbers refer to like elements throughout. In the drawings, the thicknesses of layers, films, and regions may be exaggerated for clarity.

The terminology used herein is for the purpose of describing particular example embodiments of the present invention and is not intended to be limiting of the described example embodiments of the present invention. The use of the terms first, second, etc. do not denote any order or importance, but rather, the terms first, second, etc. are used to distinguish one element from another element. It is to be understood that the singular forms "a" and "an" include plural references as well unless the context clearly dictates otherwise.

It will be further understood that the terms "comprises," "comprising," "includes," and/or "including", when used in this specification, specify the presence of the stated features, integers, steps, operations, elements, and/or components but do not preclude the presence or addition of one or more other features, integers, steps, operations, elements, components, and/or groups thereof. It will be understood that when an element or layer is referred to as being "on", "connected to," or "coupled to" another element or layer, it may be directly on, connected, or coupled to the other element or layer or intervening elements or layers may be present. When an element is referred to as being "directly on," "directly connected to," or "directly coupled to" another element or layer, there are no intervening elements or layers present.

As used herein, the term "and/or" includes any and all combinations of one or more of the associated listed items. Further, the use of "may" when describing embodiments of the present invention relates to "one or more embodiments of the present invention." Expressions, such as "at least one of," when preceding a list of elements, modify the entire list of elements and do not modify the individual elements of the list. Also, the term "exemplary" is intended to refer to an example or illustration. As used herein, the terms "use," "using," and "used" may be considered synonymous with the terms "utilize," "utilizing," and "utilized," respectively.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

Hereinafter, aspects of the present invention will be explained, in detail, with reference to the accompanying drawings.

FIG. 1 is a perspective view of a display device DD according to an exemplary embodiment of the present disclosure.

A display surface on which an image IM is displayed is substantially parallel to a surface (or a plane) defined by a first direction DR1 and a second direction DR2. A normal line direction of the display surface (e.g., a thickness direction of the display device DD) indicates a third direction DR3. In each member or component of the display device DD, a front surface (or upper surface), a rear surface (or lower surface), and directions indicated by the first, second, and third directions DR1, DR2, and DR3 are relative to each other, and thus, the front and rear surfaces and the first to third direction DR1-DR3 may be respectively changed to refer to any other suitable surfaces and/or directions.

The display device DD shown in FIG. 1 may be applied to a large-sized electronic item, such as a television set, a monitor, etc., and to small and medium-sized electronic items, such as a mobile phone, a tablet, a car navigation unit, a game unit, a smart watch, etc., but the display device DD should not be limited thereto or thereby.

Referring to FIG. 1, the display device DD includes a display area DA in which the image IM is displayed and a non-display area disposed adjacent to the display area DA. The image IM is not displayed in the non-display area. Hereinafter, the non-display area will be referred to as a second non-light emitting area NLU2. FIG. 1 shows a vase as the image IM. The display area DA has a substantially quadrangular shape, and the second non-light emitting area NLU2 is disposed at an outer side of the display area DA to surround (e.g., to surround a periphery of or to be around) the display area DA. However, these areas should not be limited thereto or thereby. For example, the shape of the display area DA and the shape of the second non-light emitting area NLU2 may be changed into various suitable shapes.

Figure 2A:
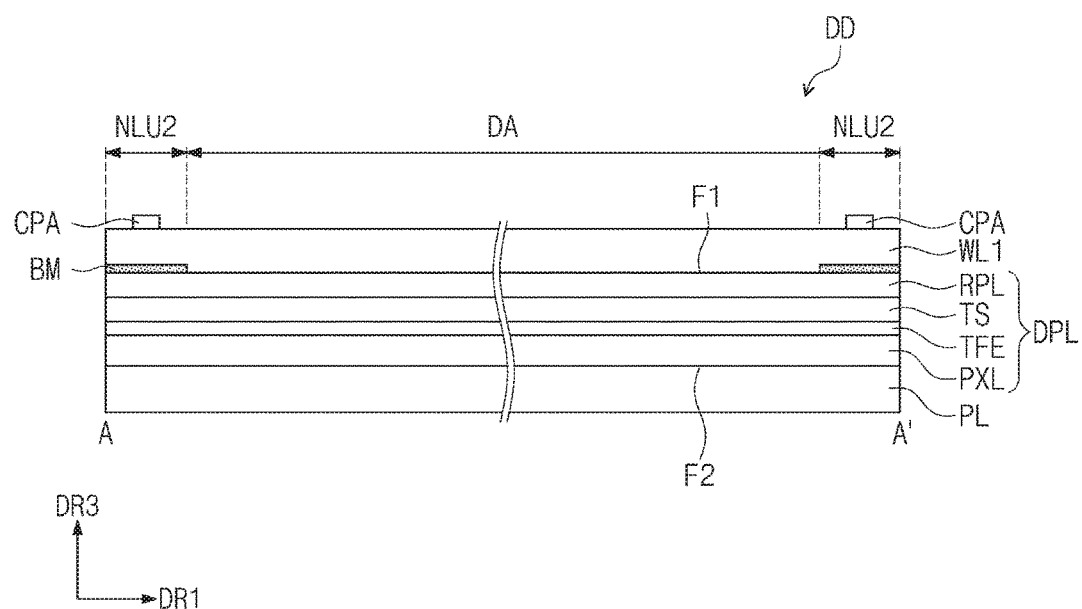
FIG. 2A is a cross-sectional view taken along the line A-A' of FIG. 1.
Figure 2B:
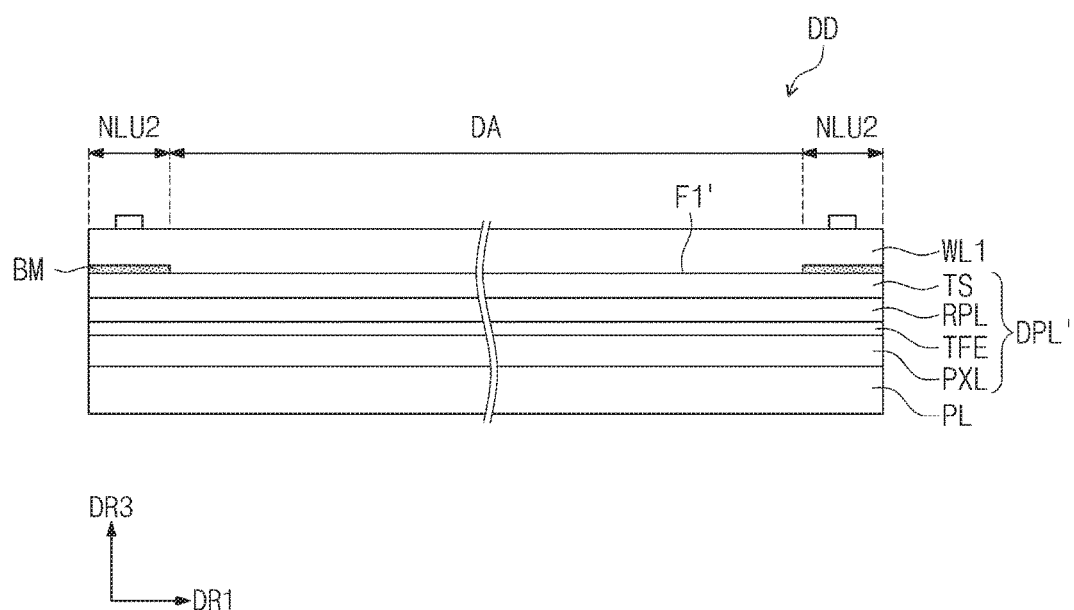
FIGS. 2B-2D are cross-sectional views of a stacked structure of layers included in a display panel layer according to exemplary embodiments of the present disclosure.
Figure 2C:
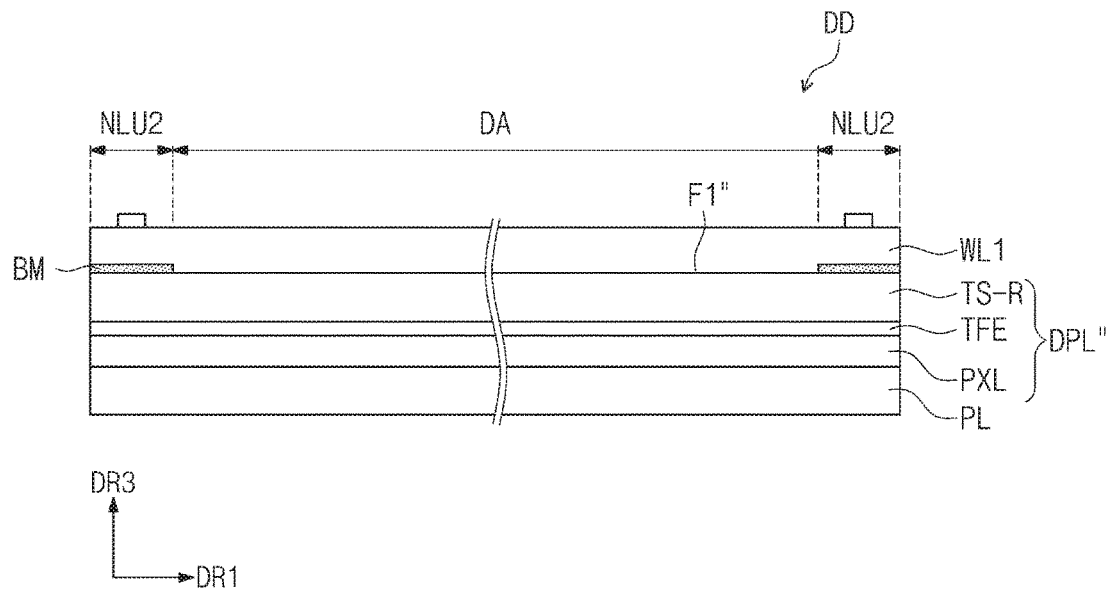
Figure 2D:
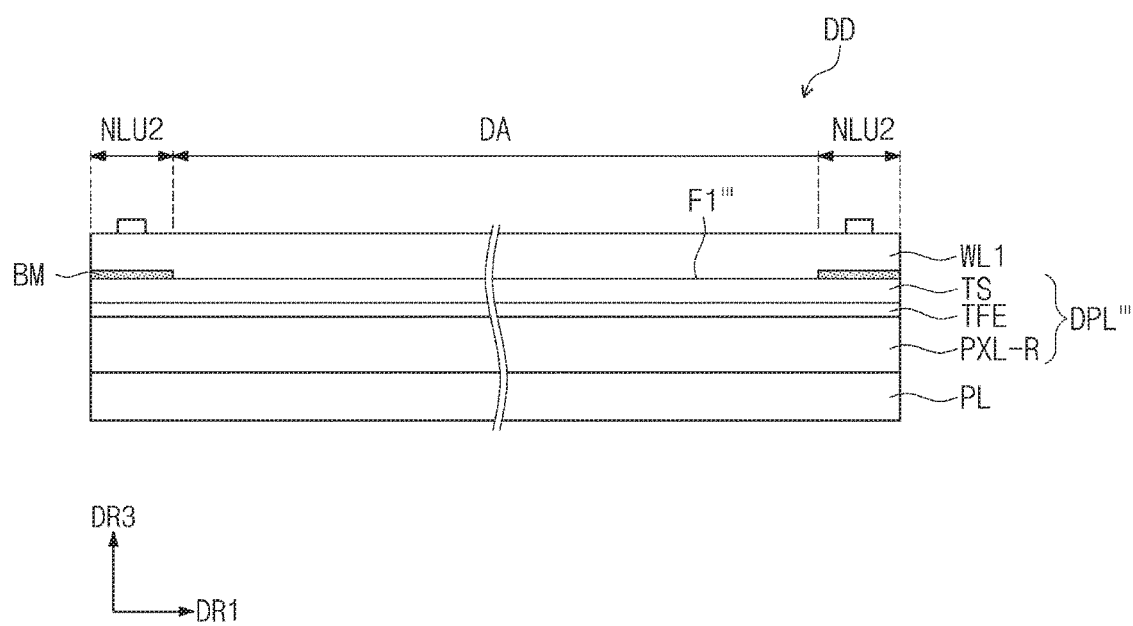

A curl-preventing pattern CPA may be arranged corresponding to the second non-light emitting area NLU2 as shown in FIGS. 1-2D. For example, the curl-preventing pattern CPA overlaps (e.g., overlaps with or is on) the second non-light emitting area NLU2 in the thickness direction (e.g., the third direction DR3).

The curl-preventing pattern CPA will be described in more detail later.

FIG. 2A is a cross-sectional view taken along the line A-A' of FIG. 1, and FIGS. 2B-2D are cross-sectional views showing a stacked structure of layers included in a display panel layer according to exemplary embodiments of the present disclosure.

Referring to FIG. 2A, the display device DD includes the curl-preventing pattern CPA, a window coating layer WL1, a display panel layer DPL, a black matrix BM, and a base substrate PL.

The display panel layer DPL includes a reflection-preventing layer RPL, a touch layer TS, an encapsulation layer TFE, and a pixel layer PXL.

The base substrate PL, the pixel layer PXL, the encapsulation layer TFE, the touch layer TS, the reflection-preventing layer RPL, the window coating layer WL1, and the curl-preventing pattern CPA may be integrally formed with each other through successive processes.

In the display device DD according to the present exemplary embodiment, the base substrate PL, the pixel layer PXL, the encapsulation layer TFE, the touch layer TS, the reflection-preventing layer RPL, and the window coating layer WL1 are sequentially stacked, and the curl-preventing pattern CPA is disposed on the window coating layer WL1. However, the structure of the display device DD should not be limited thereto or thereby. For example, the stacking order of the layers may be changed, one or more of the layers may be omitted, or two layers may be replaced with one layer. Details of the structure of the display device DD according to other embodiments will be described in more detail with reference to FIGS. 2B-2D.

The display panel layer DPL includes a first surface F1 and a second surface F2 opposite to the first surface F1 in the third direction DR3.

In the exemplary embodiment illustrated in FIG. 2A, the first surface F1 may be an upper surface of the reflection-prevention layer RPL, and the second surface F2 may be a lower surface of the pixel layer PXL. However, because the stacking order of the layers included in the display panel layer DPL may be changed as described above, the first surface F1 may be an upper surface of any one of the layers without being limited to an upper surface of a certain layer, and the second surface F2 may be a lower surface of any one of the layers without being limited to a lower surface of a certain layer.

The base substrate PL protects the pixel layer PXL. The base substrate PL provides a lower surface of the display device DD. The base substrate PL prevents external moisture from entering or reduces the amount of external moisture that enters the pixel layer PXL and absorbs external impacts. The base substrate PL may include polyethersulfone (PES), polyacrylate (PAR), polyetherimide (PEI), polyethylene naphthalate (PEN), polyethylene terephthalate (PET), polyphenylene sulfide (PPS), polyarylate, polyimide (PI), polycarbonate (PC), poly(arylene ether sulfone), and/or a combination thereof.

The material for the base substrate PL should not be limited to plastic resins and, for example, may include an organic-inorganic composite material. The base substrate PL may include a porous organic material and an inorganic material filled in the pores of the organic layer.

The pixel layer PXL generates the image IM (for example, refer to FIG. 1) in response to image data input thereto.

The pixel layer PXL may be an organic light emitting display panel, an electrophoretic display panel, or an electrowetting display panel, but the pixel layer PXL should not be limited thereto or thereby. In the present exemplary embodiment, the pixel layer PXL will be described as being an organic light emitting display panel, and detailed descriptions of the organic light emitting display panel will be further described later.

The encapsulation layer TFE is disposed on the pixel layer PXL.

The encapsulation layer TFE is disposed to encapsulate (e.g., to cover) the pixel layer PXL. The encapsulation layer TFE prevents the pixel layer PXL from degrading or deteriorating due to external moisture or oxygen or mitigates the effects of external moisture or oxygen to the pixel layer PXL. The encapsulation layer TFE includes an organic material and may have a structure in which an organic layer and an inorganic layer are stacked.

The touch layer TS obtains coordinate information of an external input. The touch layer TS is disposed on an upper surface of the encapsulation layer TFE. In the present exemplary embodiment, the touch layer TS, the pixel layer PXL, and the encapsulation layer TFE are formed through successive processes.

In the present exemplary embodiment, the touch layer TS may be an electrostatic capacitive-type touch sensing member, but the touch layer TS should not be limited thereto or thereby. For example, the touch layer TS may be another touch layer (e.g., another type of touch layer), for example, an electromagnetic induction-type touch panel, which includes two types of touch electrodes.

The reflection-preventing layer RPL is disposed on an upper surface of the touch layer TS. The reflection-preventing layer RPL is disposed at an outermost position of the display panel layer DPL (e.g., the reflection-preventing layer RPL is an outermost layer of the display panel layer DPL).

The reflection-preventing layer RPL reduces reflectivity of the light incident from the outside (e.g., external light). For instance, the reflection-preventing layer RPL may include a polarizing plate and a retardation film to polarize the light incident thereto to reduce the reflectivity of the incident light or to destructively interfere with the incident light to reduce the reflectivity thereof. In other embodiments, the reflection-preventing layer RPL may include a plurality of color filter layers or a light absorbing member (e.g., a black matrix) to absorb the incident light, thereby reducing the reflectivity thereof.

In the present exemplary embodiment, the reflection-preventing layer RPL and the touch layer TS are formed through consecutive processes. The reflection-preventing layer RPL may serve as a part of (e.g., may be integral with) the touch layer TS.

The black matrix BM is disposed on an upper surface of the display panel layer DPL (e.g., on the first surface F1) to overlap or cover an entire area of the second non-light emitting area NLU2. The black matrix BM includes various materials for absorbing light. In general, the black matrix BM includes a black organic material mixed with a black pigment or chromium oxide ($CrO_x$). Because the black matrix BM is disposed in the second non-light emitting area NLU2, lines used to drive the display device DD are not perceived by (i.e., are not visible to) a user. In addition, the black matrix BM absorbs the external light, and thus, reflection of the external light is reduced.

The window coating layer WL1 includes a transparent material.

The window coating layer WL1 includes a material having superior elasticity. As an example, the window coating layer WL1 may include an elastomer.

In addition, the window coating layer WL1 may include a material having superior hardness characteristics. For instance, the window coating layer WL1 may include a thermoset material, such as polyurethane, urethane acrylate, silicone, etc.

Further, the window coating layer WL1 may include a material obtained by (e.g., may be formed by) mixing the elastomer and the thermoset material, but the window coating layer WL1 should not be limited thereto or thereby.

The window coating layer WL1 has a thickness that is not limited to a certain value. For instance, in some embodiments, the window coating layer WL1 has a thickness equal to or greater than about 100 micrometers up to about 1 millimeter.

The window coating layer WL1 may be disposed at an outermost position of the display device DD to be exposed to the outside (e.g., the window coating layer WL1 may be an outermost layer of the display device DD).

The window coating layer WL1 is directly disposed on the upper surface of the reflection-preventing layer RPL and the upper surface of the black matrix BM (e.g., on the first surface F1 corresponding to the upper surface of the reflection-preventing layer RPL and the upper surface of the black matrix BM). For example, the window coating layer WL1 is directly disposed on the upper surface of the reflection-preventing layer RPL and the upper surface of the black matrix BM without using an adhesive member, such as an optical clear adhesive (OCA), an optical clear resin (OCR), a pressure sensitivity adhesive (PSA), etc.

In the present exemplary embodiment, the window coating layer WL1 is formed through a coating or printing method. For instance, the window coating layer WL1 may be formed on the upper surface of the reflection-preventing layer RPL and the upper surface of the black matrix BM without using an adhesive member through a roll coating method, a silk screen coating method, a spray coating method, or a slit coating method. However, the method of forming the window coating layer WL1 on the first surface F1 and the upper surface of the black matrix BM should not be limited thereto or thereby, and the window coating layer WL1 may be directly coated on the first surface F1 and the upper surface of the black matrix BM through various suitable methods.

As shown in FIGS. 2B-2D, the stacked structure of the layers included in the display panel layer may be changed in various ways.

Referring to FIG. 2B, the reflection-preventing layer RPL of a display panel layer DPL' is disposed on an upper surface of the encapsulation layer TFE, and the touch layer TS is disposed on an upper surface of the reflection-preventing layer RPL. For example, the touch layer TS may be an outermost layer of the display panel layer DPL', and in this embodiment, a first surface F1' may be an upper surface of the touch layer TS (e.g., an outer surface of the touch layer TS), and the window coating layer WL1 may be directly disposed on the upper surface of the touch layer TS.

Referring to FIG. 2C, the reflection-preventing layer RPL (for example, refer to FIG. 2A) may be integrated into a touch layer TS-R of a display panel layer DPL". For example, the reflection-preventing layer RPL may be a part of the touch layer TS-R. The touch layer TS-R may be an outermost layer of the display panel layer DPL", and in this embodiment, a first surface F1" may correspond to an upper surface of the touch layer TS-R (e.g., an outer surface of the touch layer TS-R), and the window coating layer WL1 may be directly disposed on the upper surface of the touch layer TS-R.

Referring to FIG. 2D, the reflection-preventing layer RPL (for example, refer to FIG. 2A) may be integrated into a pixel layer PXL-R of a display panel layer DPL'". For example, the reflection-preventing layer RPL may be a part of the pixel layer PXL-R. A touch layer TS may be an outermost layer of the display panel layer DPL'", and in this embodiment, a first surface F1'" may correspond to an upper surface of the touch layer TS (e.g., an outer surface of the touch layer TS), and the window coating layer WL1 may be directly disposed on the upper surface of the touch layer TS.

The stacked structure of the layers included in the display panel layers DPL, DPL', DPL", and DPL'" should not be limited to the above-mentioned structures. In addition, some layers included in the display panel layers DPL, DPL', DPL", and DPL'" may be disposed on the window coating layer WL1. For instance, the reflection-preventing layer RPL may be disposed on the window coating layer WL1 to cover the curl-preventing pattern CPA (for example, refer to FIGS. 2A and 2B).

As described above, because the window coating layer WL1 is directly disposed on the upper surface of the display panel layer DPL without using an adhesive member, the display panel layer DPL may not be pressed or compressed when the window coating layer WL1 is attached to the display panel layer DPL, and the resilience of the flexible display device may not be reduced due to a creep property of an adhesive member. In addition, a manufacturing process of the display device DD is simplified, and thus, the flexible display device is easily implemented.

As shown in FIGS. 2A-2D, the curl-preventing pattern CPA is disposed on the upper surface of the window coating layer WL1 to correspond to the second non-light emitting area NLU2.

For example, the curl-preventing pattern CPA may be disposed on the upper surface of the window coating layer WL1 corresponding to the second non-light emitting area NLU2 to be exposed to the outside (e.g., the curl-preventing pattern CPA may be exposed outside of the display device DD).

As described above, the second non-light emitting area NLU2 surrounds (e.g., surrounds a periphery of or is around) the display area DA, and thus, similar to the second non-light emitting area NLU2, the curl-preventing pattern CPA has a shape surrounding (e.g., surrounding a periphery of) the display area DA when viewed in a plan view. For instance, the curl-preventing pattern CPA may have a closed-loop shape.

The curl-preventing pattern CPA may be formed by a deposition or silk printing method.

The curl-preventing pattern CPA includes a material having a relatively high elastic modulus (or Young's modulus). For example, the curl-preventing pattern CPA includes an organic material or an inorganic material having a relatively high elastic modulus. The elastic modulus of the curl-preventing pattern CPA is equal to or greater than an elastic modulus of the display panel layer DPL and greater than an elastic modulus of the window coating layer WL1. For instance, the elastic modulus of the curl-preventing pattern CPA is equal to or greater than about 6 GPa and equal to or less than about 10 GPa, and the elastic modulus of the window coating layer WL1 is about 10 MPa.

The display device DD includes the curl-preventing pattern CPA, and thus, the window coating layer WL1 may be prevented from being hardened and shrunk when the window coating layer WL1 is formed thereon. In addition, the window coating layer WL1 may be prevented from being delaminated or curled due to a non-constant thermal expansion coefficient (e.g., a thermal expansion coefficient difference) in the window coating layer WL1. Further, because the curl-preventing pattern CPA is disposed to overlap the second non-light emitting area NLU2, the lamination or curl phenomenon of the window coating layer WL1 may be prevented or reduced.

Hereinafter, the display panel layer DPL shown in FIG. 2A will be described as a representative example.

Figure 3A:
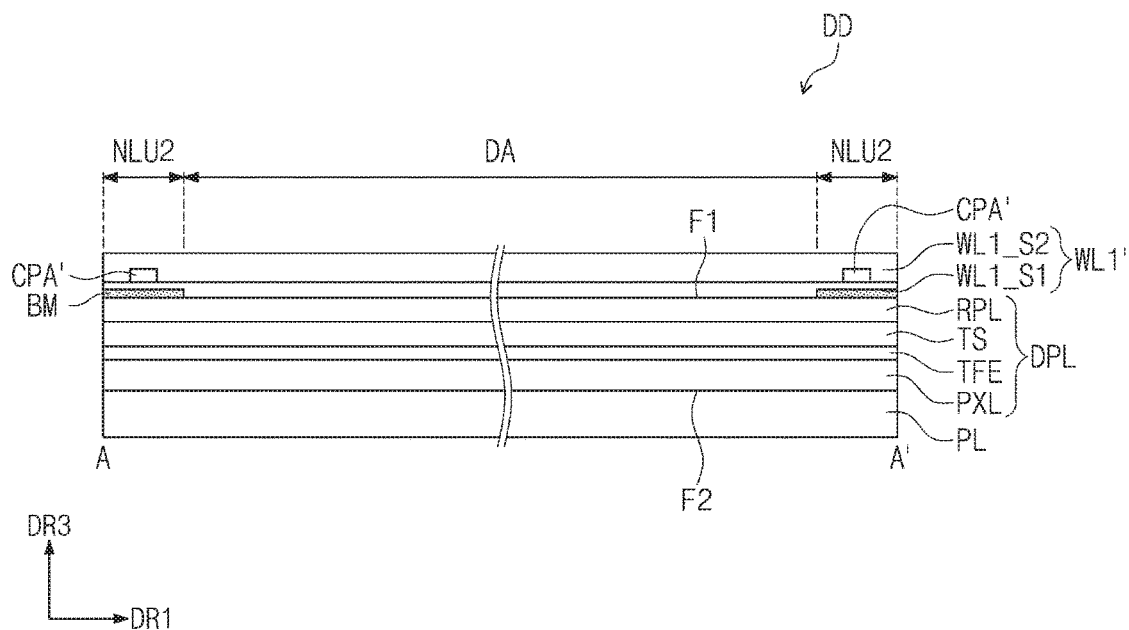
FIGS. 3A and 3B are cross-sectional views of display devices according to exemplary embodiments of the present disclosure.
Figure 3B:
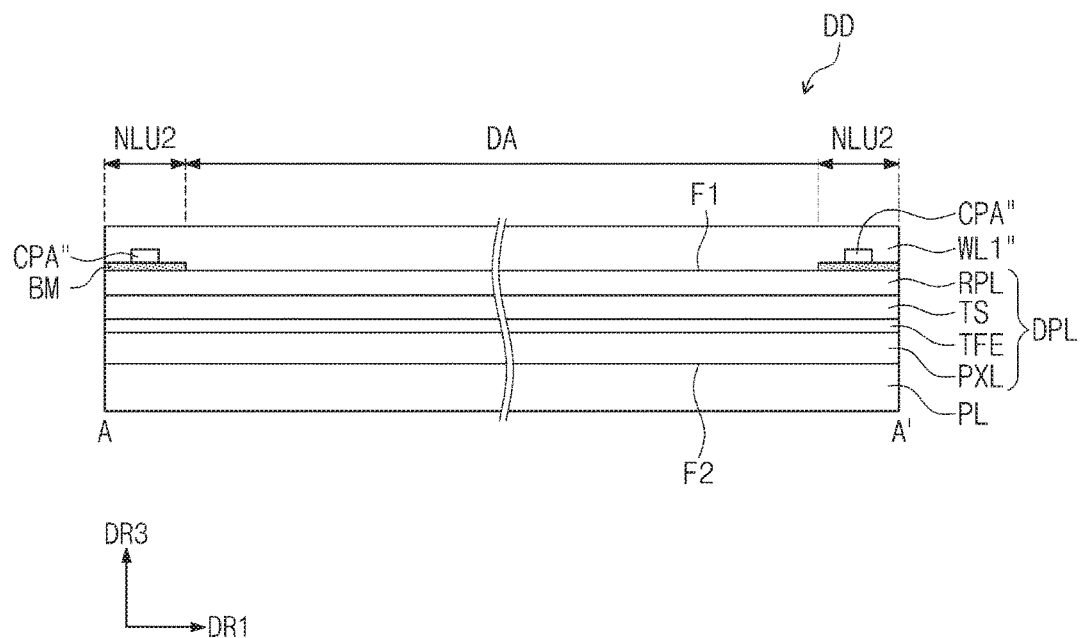

FIGS. 3A and 3B are cross-sectional views showing display devices according to exemplary embodiments of the present disclosure.

Referring to FIG. 3A, a curl-preventing pattern CPA' is disposed at a position different from the position of the curl-preventing pattern CPA shown in FIG. 2A.

The curl-preventing pattern CPA' is disposed in a window coating layer WL1'.

The window coating layer WL1' shown in FIG. 3A includes a first sub-window coating layer WL1_S1 and a second sub-window coating layer WL1_S2.

The first sub-window coating layer WL1_S1 is directly disposed on the upper surface of the reflection-preventing layer RPL and the upper surface of the black matrix BM. The first sub-window coating layer WL1_S1 has the same or substantially the same properties as, includes the same material as, and is formed through the same process as the window coating layer WL1 shown in FIG. 2A.

The curl-preventing pattern CPA' is disposed on the first sub-window coating layer WL1_S1. The curl-preventing pattern CPA' is disposed on the first sub-window coating layer WL1_S1 through the method(s) described above with reference to FIG. 2A.

The second sub-window coating layer WL1_S2 is disposed on the first sub-window coating layer WL1_S1 to cover the curl-preventing pattern CPA'. The second sub-window coating layer WL1_2 has the same or substantially the same properties as, includes the same material as, and is formed through the same process as the first sub-window coating layer WL1_S1. Consequently, the curl-preventing pattern CPA' is sealed by the first and second sub-window coating layers WL1_S1 and WL1_S2, and thus, the curl-preventing pattern CPA' is formed in the window coating layer WL1' because the entire surface of the curl-preventing pattern CPA' contacts the window coating layer WL1'. As described above, when the curl-preventing pattern CPA' is formed in the window coating layer WL1', the curl-preventing pattern CPA' does not protrude to the outside of the display device DD.

Referring to FIG. 3B, a curl-preventing pattern CPA" is disposed at a position different from the position of the curl-preventing patterns CPA and CPA' respectively shown in FIGS. 2A and 3A.

As shown in FIG. 3B, the curl-preventing pattern CPA" is disposed on a portion of the upper surface of the black matrix BM. A window coating layer WL1" is directly disposed on the first surface F1 and the upper surface of the black matrix BM to cover the curl-preventing pattern CPA".

For example, the curl-preventing pattern CPA" is disposed on the upper surface of the black matrix BM such that the whole surface of the curl-preventing pattern CPA" except for a bottom surface of the curl-preventing pattern CPA" contacts the window coating layer WL1".

As described above, when the curl-preventing pattern CPA" is formed on the first surface F1, the curl-preventing pattern CPA" does not protrude to the outside of the display device DD and convenience of processes of manufacturing the display device may be improved.

Figure 4A:
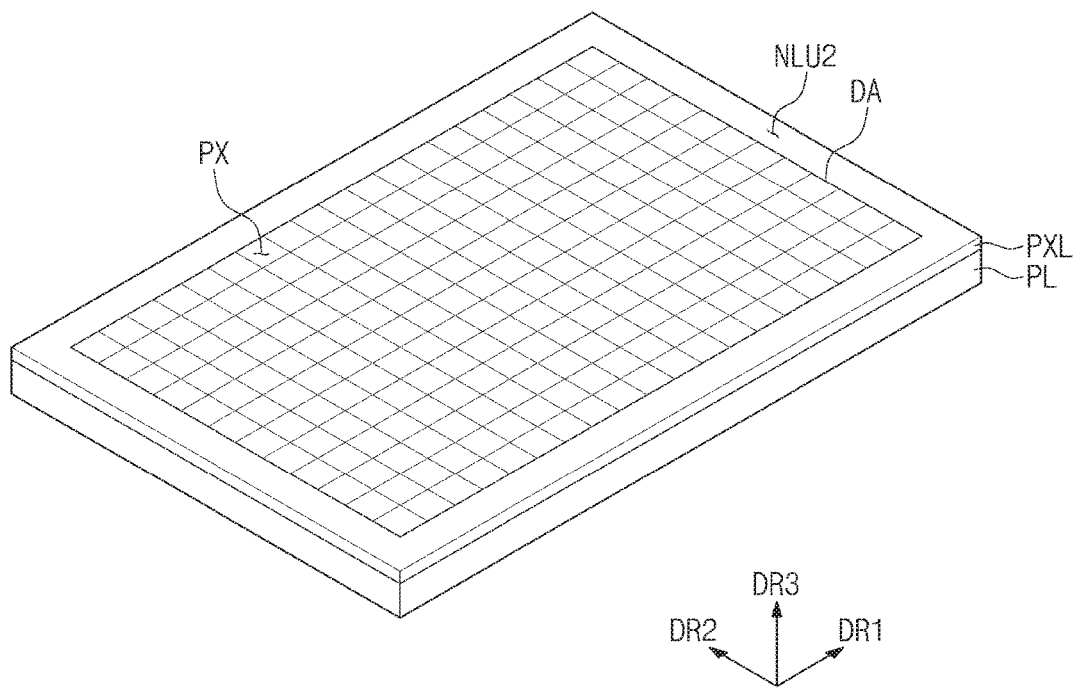
FIG. 4A is a perspective view showing a base substrate and a pixel layer according to an exemplary embodiment of the present disclosure.
Figure 4B:
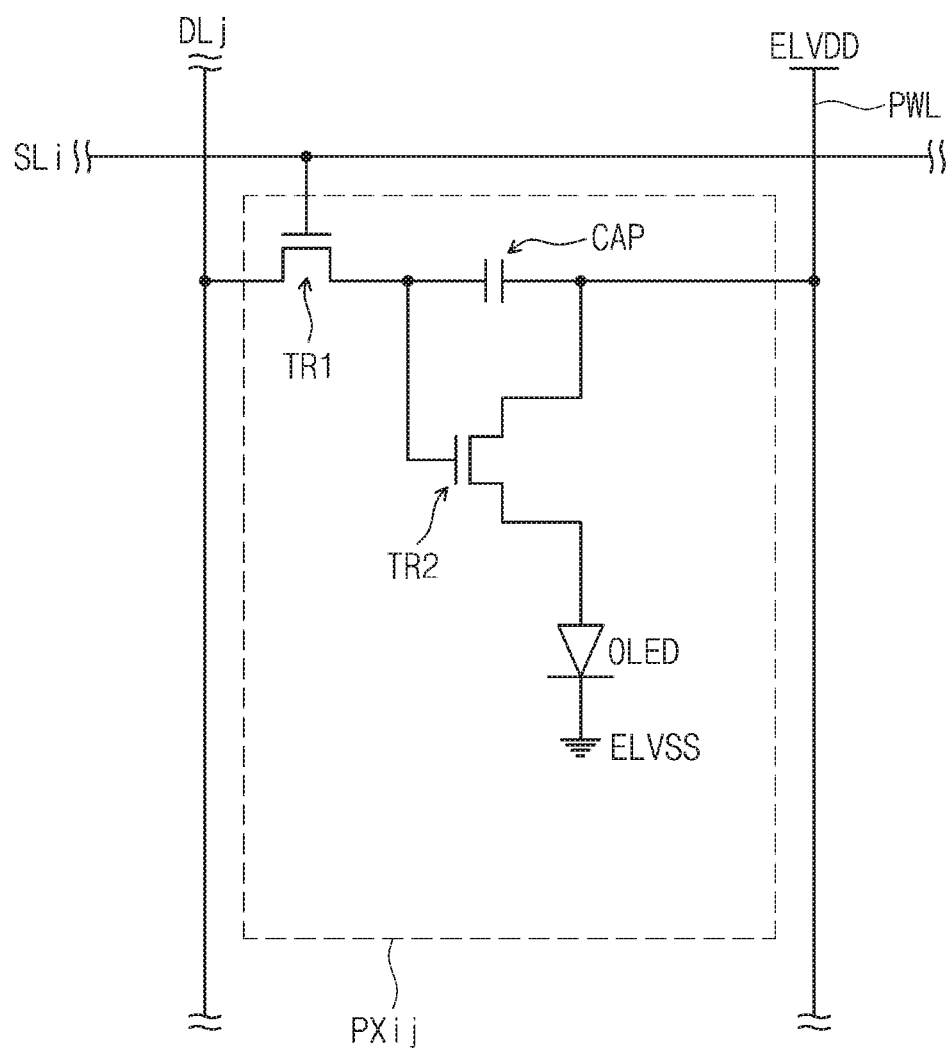
FIG. 4B is an equivalent circuit diagram of a pixel according to an exemplary embodiment of the present disclosure.
Figure 5A:
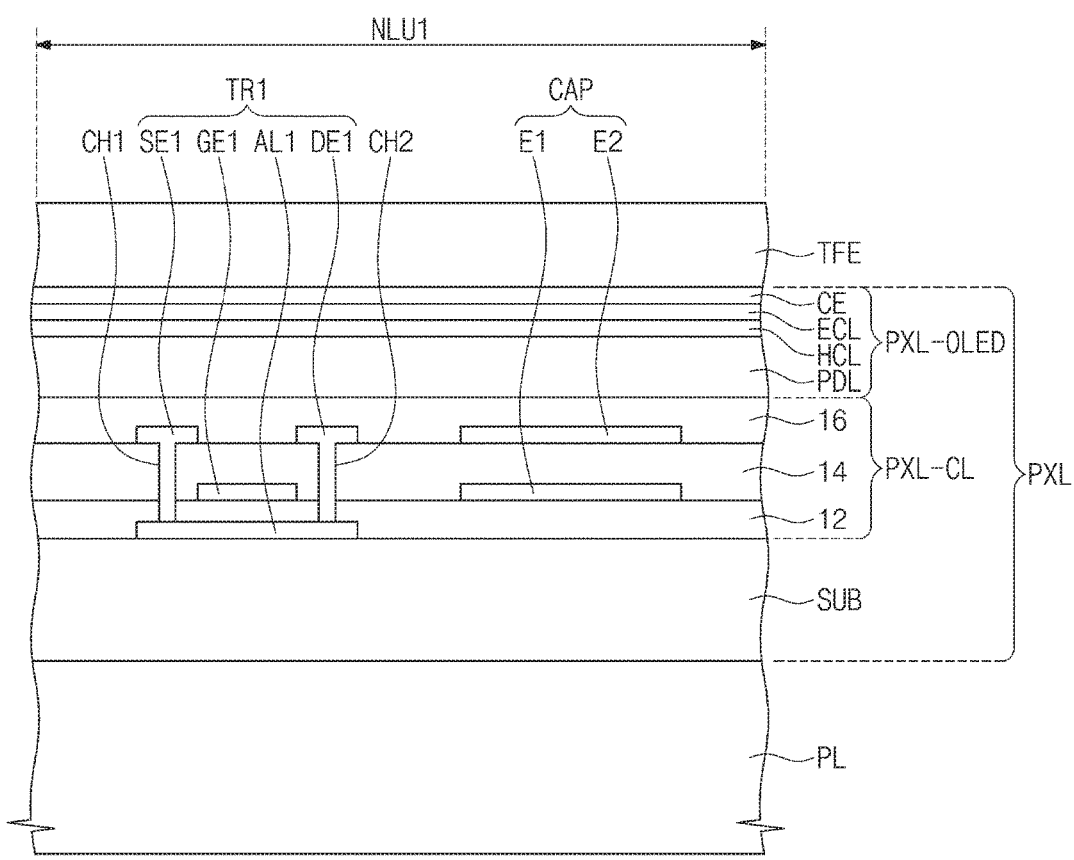
FIG. 5A is a cross-sectional view showing a first transistor and a capacitor shown in FIG. 4B.
Figure 5B:
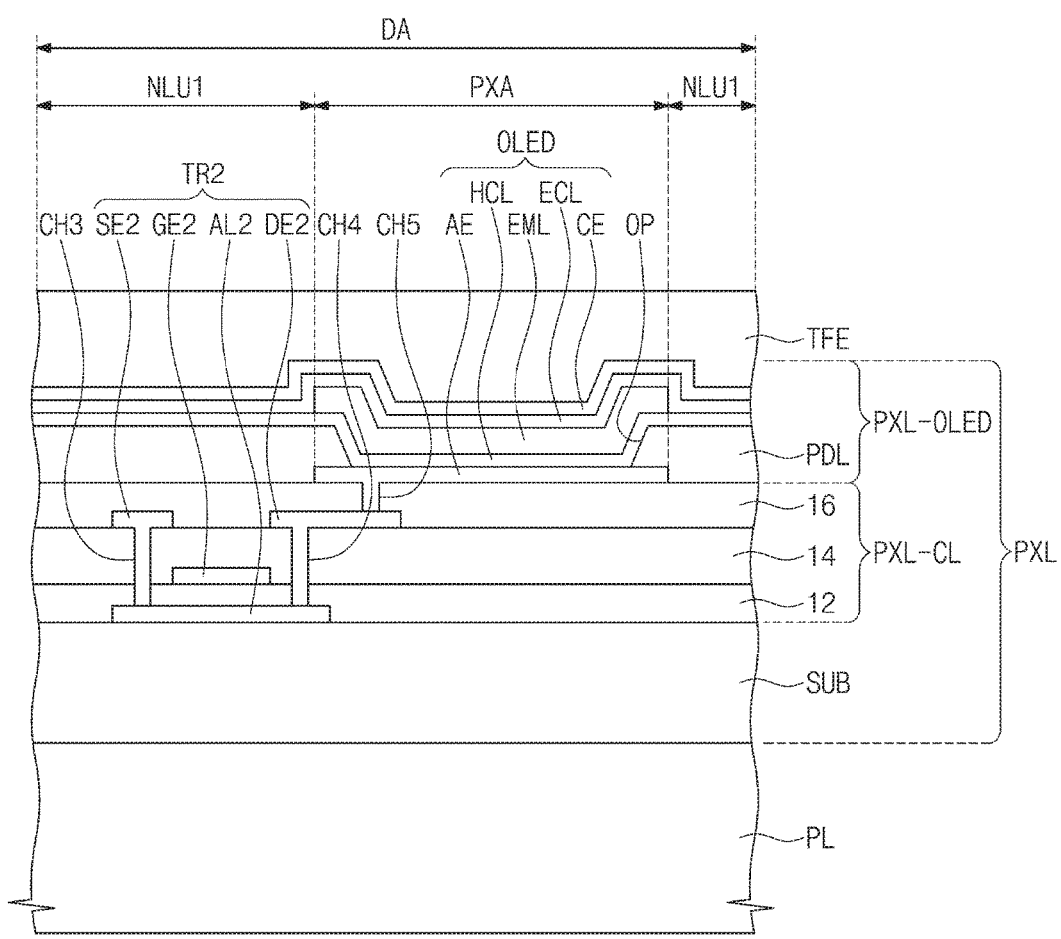
FIG. 5B is a cross-sectional view showing a second transistor and an organic light emitting device shown in FIG. 4B.

FIG. 4A is a perspective view of a base substrate and a pixel layer according to an exemplary embodiment of the present disclosure, FIG. 4B is an equivalent circuit diagram of a pixel according to an exemplary embodiment of the present disclosure, FIG. 5A is a cross-sectional view showing a first transistor and a capacitor shown in FIG. 4B, and FIG. 5B is a cross-sectional view showing a second transistor and an organic light emitting device shown in FIG. 4B.

Referring to FIGS. 4A and 4B, the pixel layer PXL includes a plurality of pixels PX arranged in the display area DA. In FIG. 4A, the pixels PX are arranged in a matrix form, but the arrangement of the pixels PX should not be limited to the matrix form. For instance, the pixels PX may be arranged in a PenTile™ scheme. PenTile™ is owned by Samsung Display Co., Ltd. with a place of business in the Republic of Korea.

FIG. 4B is an equivalent circuit diagram of one pixel PXij connected to an i-th scan line SLi and a j-th source line DLj. Each of the pixels PX has the same or substantially the same structure and function as the one pixel PXij.

The pixel PXij includes one or more transistors, such as first and second transistors TR1 and TR2, one or more capacitors CAP, and an organic light emitting diode OLED. In the present exemplary embodiment, the pixel driving circuit includes the first and second transistors TR1 and TR2 and the one capacitor CAP, but the pixel driving circuit should not be limited thereto or thereby.

The organic light emitting diode OLED includes an anode AE (for example, refer to FIG. 5B) for receiving a first power source voltage ELVDD provided through the second transistor TR2 from a power source line PWL. The organic light emitting diode OLED also includes a cathode CE (for example, refer to FIG. 5B) for receiving a second power source voltage ELVSS. The first transistor TR1 outputs a data signal provided through the j-th source line DLj in response to a scan signal provided through the i-th scan line SLi. The capacitor CAP is charged with a voltage corresponding to the data signal from the first transistor TR1. The second transistor TR2 controls a driving current flowing through the organic light emitting diode OLED in response to the voltage charged in the capacitor CAP.

Referring to FIGS. 5A and 5B, the pixel layer PXL is disposed on the base substrate PL.

The pixel layer PXL includes a base layer SUB, a circuit layer PXL-CL, and an organic light emitting diode layer PXL-OLED. The circuit layer PXL-CL includes a plurality of conductive layers and a plurality of insulating layers.

The base substrate PL has a thickness greater than that of the base layer SUB to effectively perform a protection function. In some embodiments, the base substrate PL may be omitted in accordance with the structure of the base layer SUB.

The base layer SUB is disposed on the base substrate PL. The base layer SUB may be, but is not limited to, a flexible substrate. The base substrate PL may include a plastic substrate including polyimide, a glass substrate, a metal substrate, or an organic-inorganic composite substrate.

The organic light emitting diode layer PXL-OLED includes a plurality of conductive layers and a plurality of functional organic layers.

A semiconductor pattern AL1 (hereinafter referred to as a first semiconductor pattern) of the first transistor TR1 and a semiconductor pattern AL2 (hereinafter referred to as a second semiconductor pattern) of the second transistor TR2 are disposed on the base layer SUB. The first and second semiconductor patterns AL1 and AL2 may include amorphous silicon (a-Si) formed at a relatively low temperature. In addition, the first and second semiconductor patterns AL1 and AL2 may include a metal oxide semiconductor. Functional layers may be further disposed on one surface (e.g., on an upper surface) of the base layer SUB. The functional layers may include a barrier layer and/or a buffer layer. In these embodiments, the first and second semiconductor patterns AL1 and AL2 are disposed on the barrier layer and/or the buffer layer.

A first insulating layer 12 is disposed on the base substrate SUB to cover the first and second semiconductor patterns AL1 and AL2. The first insulating layer 12 includes an organic layer and/or an inorganic layer. In some embodiments, the first insulating layer 12 includes a plurality of inorganic thin film layers. The inorganic thin film layers include a silicon nitride layer and a silicon oxide layer.

A control electrode GE1 (hereinafter referred to as a first control electrode) of the first transistor TR1 and a control electrode GE2 (hereinafter referred to as a second control electrode) of the second transistor TR2 are disposed on the first insulating layer 12. A first electrode E1 of the capacitor CAP is disposed on the first insulating layer 12. The first control electrode GE1, the second control electrode GE2, and the first electrode E1 are manufactured by the same photolithography process as the scan line SLi (for example, refer to FIG. 4B). For example, the first electrode E1 includes the same material as the scan line SLi.

A second insulating layer 14 is disposed on the first insulating layer 12 to cover the first control electrode GE1, the second control electrode GE2, and the first electrode E1. The second insulating layer 14 includes an organic layer and/or an inorganic layer. In some embodiments, the second insulating layer 14 includes a plurality of inorganic thin film layers. The inorganic thin film layers include a silicon nitride layer and a silicon oxide layer.

The source line DLi (for example, refer to FIG. 4B) and the power source line PWL (for example, refer to FIG. 4B) are disposed on the second insulating layer 14. An input electrode SE1 (hereinafter referred to as a first input electrode) and an output electrode DE1 (hereinafter referred to as a first output electrode) of the first transistor TR1 are disposed on the second insulating layer 14. The first input electrode SE1 is branched from the source line SLi. The second input electrode SE2 is branched from the power source line PWL.

A second electrode E2 of the capacitor CAP is formed on the second insulating layer 14 through the same photolithography process used to form the source line DLi and the power source line PWL and includes the same material as that of the source line DLi and the power source line PWL.

The first input electrode SE1 and the first output electrode DE1 are connected to the first semiconductor pattern AL1 through a first opening CH1 and a second opening CH2 (e.g., a first thru-hole and a second thru-hole), respectively, which are formed through the first and second insulating layers 12 and 14. The first output electrode DE1 is electrically connected to the first electrode E1. For instance, the first output electrode DE1 is connected to the first electrode E1 through an opening (e.g., a thru-hole) formed through the second insulating layer 14. The second input electrode SE2 and the second output electrode DE2 are connected to the second semiconductor pattern AL2 through a third opening CH3 and a fourth opening CH4 (e.g., a third thru-hole and a fourth thru-hole), respectively, which are formed through the first and second insulating layers 12 and 14. According to another exemplary embodiment, each of the first transistor TR1 and the second transistor TR2 may have a bottom gate structure.

A third insulating layer 16 is disposed on the second insulating layer 14 to cover the first input electrode SE1, the second output electrode DE2, the second input electrode SE2, and the second output electrode DE2. The third insulating layer 16 includes an organic layer and/or an inorganic layer. In some embodiments, the third insulating layer 16 includes an organic material to provide a flat or planar surface.

A pixel definition layer PDL and the organic light emitting diode OLED may be disposed on the third insulating layer 16. The pixel definition layer PDL is provided with an opening OP defined therethrough. The pixel definition layer PDL may act as another insulating layer.

The anode AE is connected to the second output electrode DE2 through a fifth opening CH5 (e.g., a fifth thru-hole) formed through the third insulating layer 16. At least a portion of the anode AE is exposed through the opening OP in the pixel definition layer PDL. A hole control layer HCL is disposed in a light emitting area PXA and a first non-light emitting area NLU1, which will be further described later. An organic light emitting layer EML and an electron control layer ECL are sequentially disposed on the hole control layer HCL. The hole control layer HCL includes a hole transport layer, and the electron control layer ECL includes an electron transport layer. Then, the cathode CE is disposed in the light emitting area PXA and the first non-light emitting area NLU1.

The encapsulation layer TFE is disposed on the cathode CE to seal the organic light emitting diode layer PXL-OLED. The encapsulation layer TFE protects the organic light emitting diode OLED from moisture and foreign contaminants.

The display area DA includes the light emitting area PXA and the first non-light emitting area NLU1.

In the present exemplary embodiment, the light emitting area PXA may be an area in which light is generated. The light emitting area PXA may be defined to correspond to the anode AE, the organic light emitting diode OLED, and/or the organic light emitting layer EML. In some embodiments, the organic light emitting layer EML generates white light.

Figure 6:
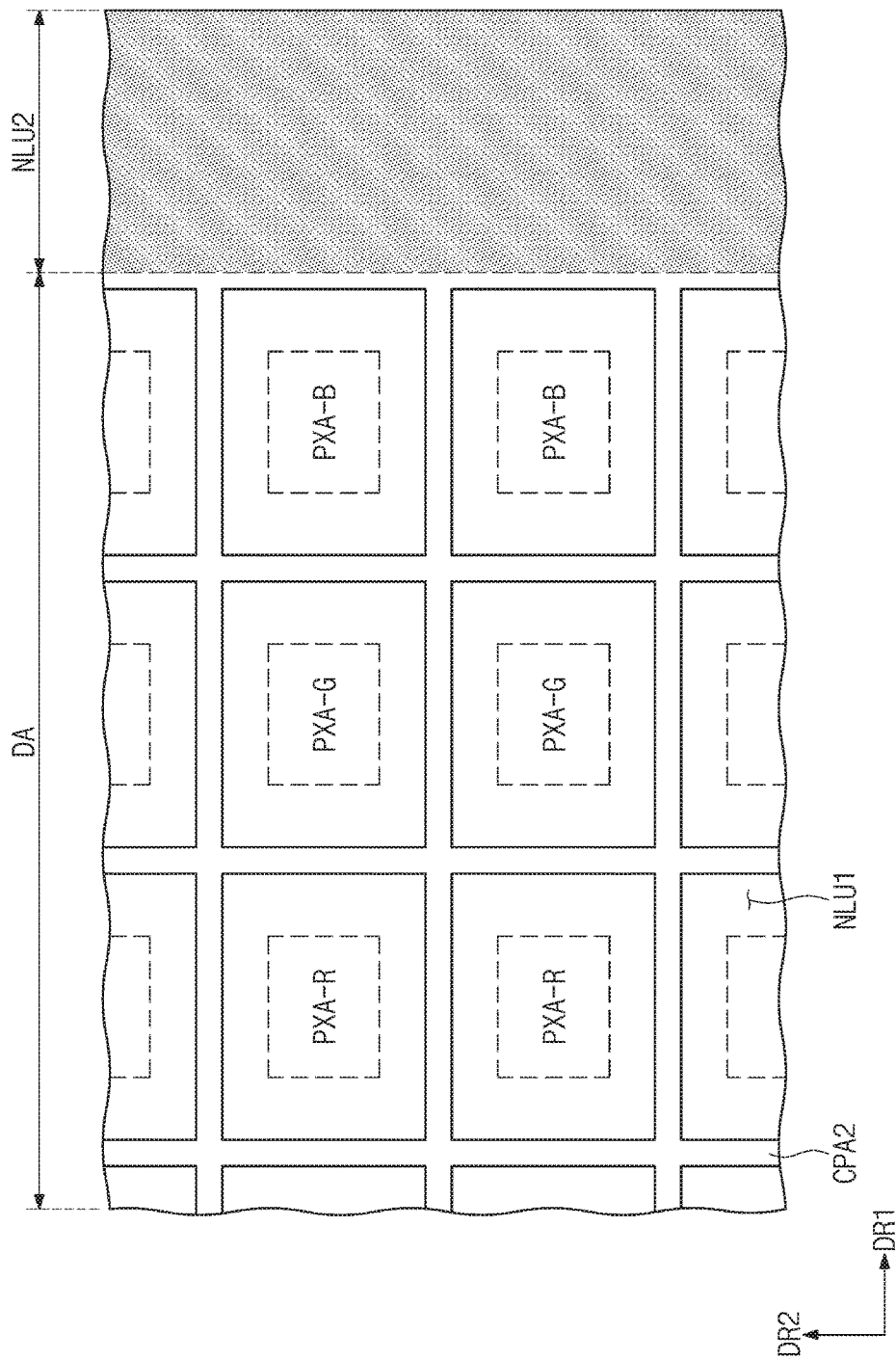
FIGS. 6 and 7 are plan views showing a curl-preventing pattern according to exemplary embodiments of the present disclosure.
Figure 7:
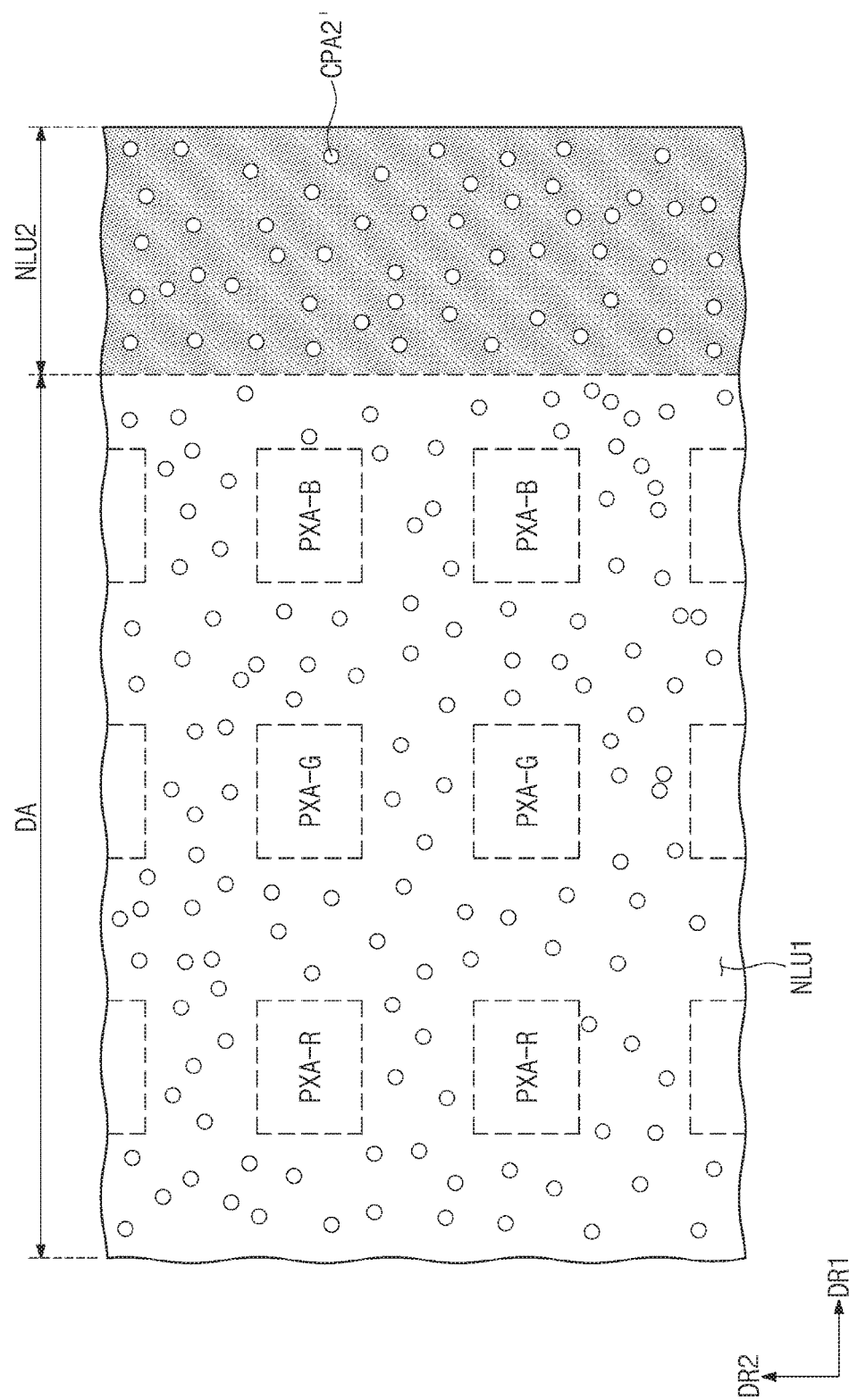

FIGS. 6 and 7 are plan views showing a curl-preventing pattern according to exemplary embodiments of the present disclosure.

Referring to FIGS. 6 and 7, the display area DA is defined by the first direction DR1 and the second direction DR2 when viewed in a plan view.

A plurality of the light emitting areas PXA is provided (e.g., light emitting areas PXA-R, PXA-G, and PXA-B). FIG. 6 shows three types of light emitting areas PXA-R, PXA-G, and PXA-B arranged in a matrix form. Light emitting diodes (e.g., organic light emitting diodes), each emitting one of three different colors, are respectively arranged in the three types of light emitting areas PXA-R, PXA-G, and PXA-B.

For example, the organic light emitting diodes OLED (for example, refer to FIG. 5B) for emitting white light are respectively arranged in the three types of light emitting areas PXA-R, PXA-G, and PXA-B. In this embodiment, three different types of color filters are disposed to respectively overlap the three types of light emitting areas PXA-R, PXA-G, and PXA-B.

In the present exemplary embodiment, the expression of "a light having a predetermined color is emitted from the light emitting area" means not only that the light generated by a corresponding light emitting diode may be emitted without being modified, but that the light generated by the corresponding light emitting diode may be emitted after the color of the light is converted. In the present exemplary embodiment, the light emitting areas may include four types of light emitting areas.

The light emitting areas PXA-R, PXA-G, and PXA-B are surrounded by the first non-light emitting area NLU1.

A curl-preventing pattern CPA2 is disposed to overlap the first non-light emitting area NLU1. For example, the curl-preventing pattern CPA2 has straight line shapes and overlaps an area between two adjacent light emitting areas from among the light emitting areas PXA. The curl-preventing pattern CPA2 may be spaced from (e.g., spaced apart from) the light emitting areas PXA-R, PXA-G, and PXA-B. For instance, the curl-preventing pattern CPA2 may have a lattice shape.

In some embodiments, the lattice shape may be extended to overlap the second non-light emitting area NLU2.

In some embodiments, the curl-preventing pattern CPA2 may be disposed on the upper surface of the window coating layer WL1 to overlap the first non-light emitting area NLU1 similar to the embodiment shown in FIG. 2A, the curl-preventing pattern CPA2 may be disposed in the window coating layer WL1' to overlap the first non-light emitting area NLU1 similar to the embodiment shown in FIG. 3A, or the curl-preventing pattern CPA2 may be disposed on the first surface F1 (e.g., on an upper surface of the black matrix BM) to overlap the first non-light emitting area NLU1 similar to the embodiment shown in FIG. 3B.

As described above, different from the curl-preventing patterns CPA1, CPA1', and CPA1" described with reference to FIGS. 2A-2C, because the curl-preventing pattern CPA2 having the lattice shape shown in FIG. 6 extends across the entire surface of the display area DA, the window coating layer may not be delaminated or curled due to hardening and shrinkage of the window coating layer.

Referring to FIG. 7, a curl-preventing pattern CPA2' has a different shape from that of the curl-preventing pattern CPA2 shown in FIG. 6.

The curl-preventing pattern CPA2' may overlap the first non-light emitting area NLU1 and the second non-light emitting layer NLU2. The curl-preventing pattern CPA2' may have a dot shape as shown in FIG. 7. The curl-preventing pattern CPA2' having the dot shape is formed by a spraying method.

The curl-preventing pattern CPA2' may be disposed on the upper surface of the window coating layer WL1 to overlap the first non-light emitting area NLU1 and the second non-light emitting area NLU2 similar to the embodiment shown in FIG. 2A, the curl-preventing pattern CPA2' may be disposed in the window coating layer WL1' to overlap the first non-light emitting area NLU1 and the second non-light emitting area NLU2 similar to the embodiment shown in FIG. 3A, or the curl-preventing pattern CPA2 may be disposed on the first surface F1 to overlap the first non-light emitting area NLU1 and the second non-light emitting area NLU2 similar to the embodiment shown in FIG. 3B.

As described above, different from the curl-preventing patterns CPA1, CPA1', and CPA1" described with reference to FIGS. 2A-2C, because the curl-preventing pattern CPA2' shown in FIG. 7 extends across the entire surface of the display area DA, the window coating layer may not be delaminated or curled due to hardening and shrinkage of the window coating layer. In addition, because the curl-preventing pattern CPA2' is formed by the spraying method, convenience of the manufacturing processes of the display device may be improved.

Figure 8:
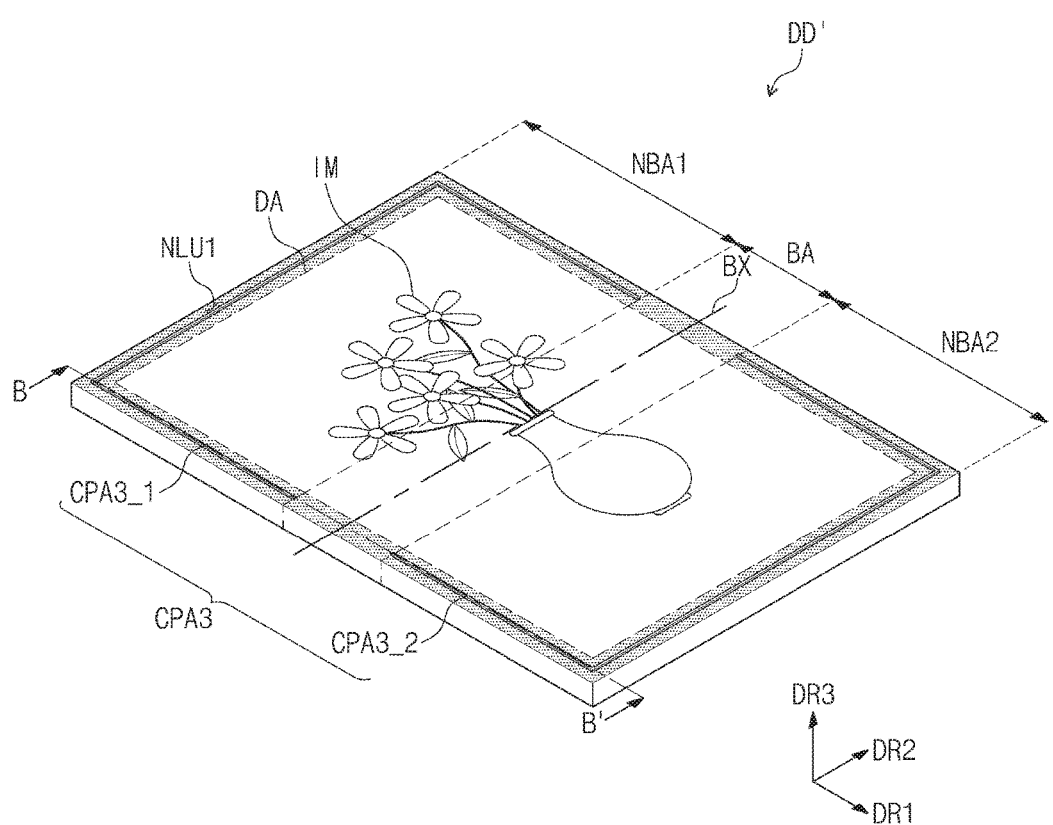
FIG. 8 is a perspective view of a display device according to another exemplary embodiment of the present disclosure.
Figure 9A:
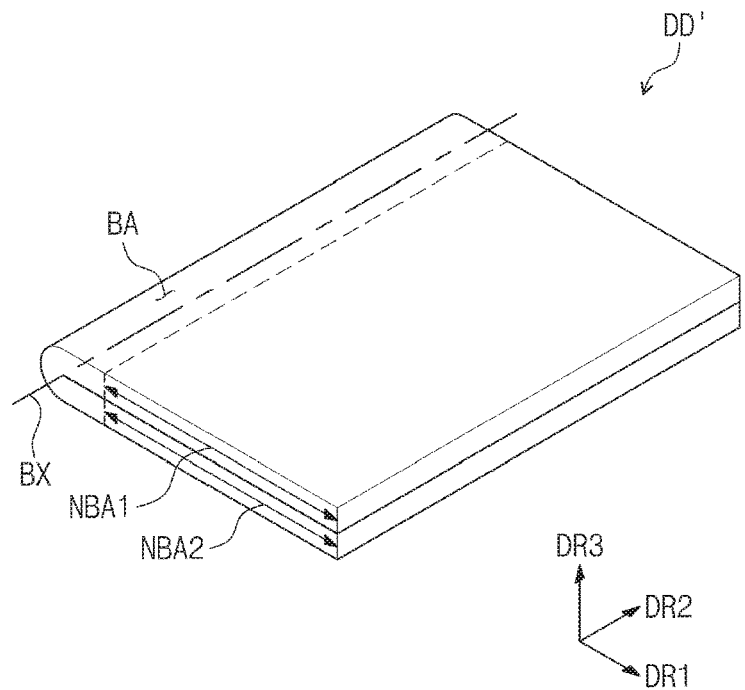
FIG. 9A is a perspective view of the display device of FIG. 8 in a first operation state.
Figure 9B:
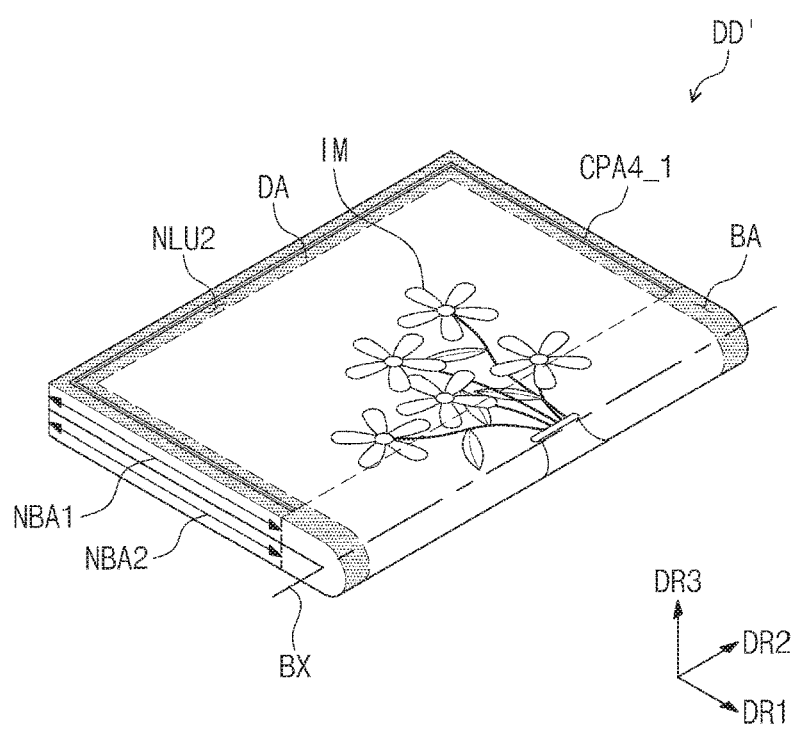
FIG. 9B is a perspective view of the display device of FIG. 8 in a second operation state.
Figure 10:
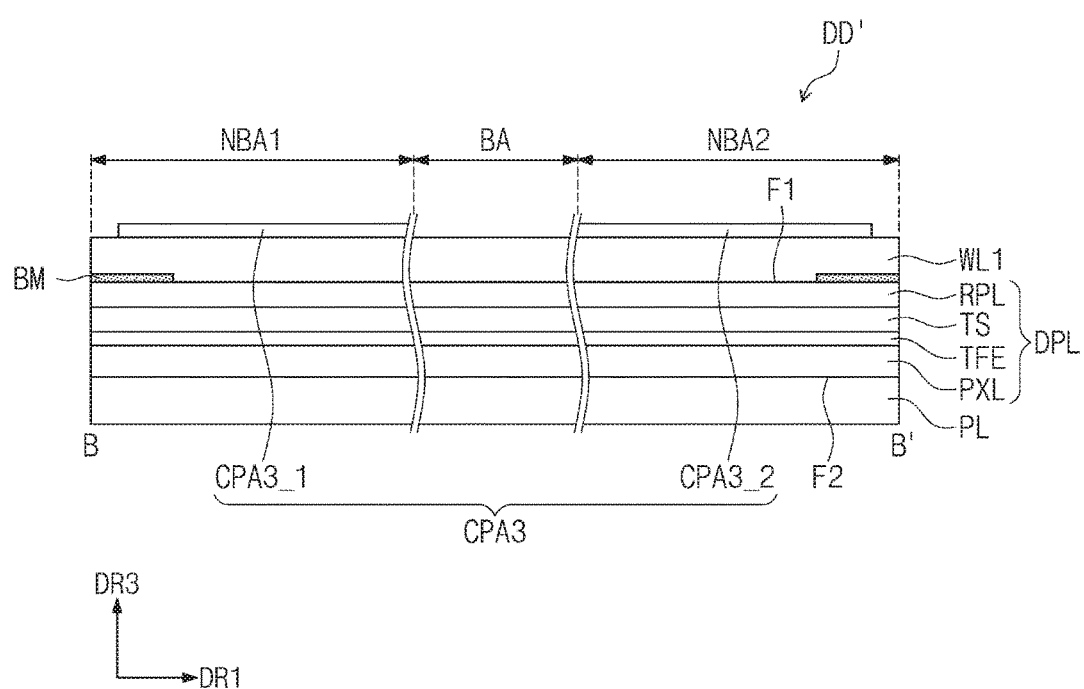
FIG. 10 is a cross-sectional view taken along the line B-B' of FIG. 8.

FIG. 8 is a perspective view of a display device according to another exemplary embodiment of the present disclosure, FIG. 9A is a perspective view of the display device of FIG. 8 in a first operation state, FIG. 9B is a perspective view of the display device of FIG. 8 in a second operation state, and FIG. 10 is a cross-sectional view taken along the line B-B' of FIG. 8.

Different from the display device DD shown in FIG. 1, a display device DD' shown in FIG. 8 may be a foldable display device. The display device DD' includes a bending area BA configured to be bent with respect to a bending axis BX and first and second non-bending areas NBA1 and NBA2, which are not configured to be bent (e.g., which are rigid).

As shown in FIG. 9A, the display device DD' may be inwardly bent (e.g., may be subjected to inner-bending) such that a display surface of an area of the display area DA corresponding to the first non-bending area NBA1 faces a display surface of an area of the display area DA corresponding to the second non-bending area NBA2. As shown in FIG. 9B, the display device DD' may be outwardly bent (e.g., may be subjected to outer-bending such that the display surface of the display area DA is exposed to the outside (e.g., is visible to a user).

Different from the curl-preventing pattern CPA, the curl-preventing pattern CPA3 shown in FIG. 8 does not overlap the bending axis BX in the third direction DR3. In the present exemplary embodiment, the curl-preventing pattern CPA3 does not overlap a portion of the second non-light emitting area NLU2 that corresponds to the bending area BA.

The curl-preventing pattern CPA3 includes a first sub-curl preventing pattern CPA3_1 and a second sub-curl preventing pattern CPA3_2. The first sub-curl preventing pattern CPA3_1 overlaps the first non-bending area NBA1 in the third direction DR3. The second sub-curl preventing pattern CPA3_2 overlaps the second non-bending area NBA2 in the third direction DR3.

Referring to FIG. 10, the curl-preventing pattern CPA3 is disposed on the window coating layer WL1. In the present exemplary embodiment, the first sub-curl preventing pattern CPA3_1 is disposed on the window coating layer WL1 to overlap the first non-bending area NBA1 in the third direction DR3, and the second sub-curl preventing pattern CPA3_2 is disposed on the window coating layer WL1 to overlap the second non-bending area NBA2 in the third direction DR3.

In other embodiments, the curl-preventing pattern CPA3 may be disposed in the window coating layer WL1 to overlap the first and second non-bending areas NBA1 and NBA2 in the third direction DR3 similar to the embodiment illustrated in FIG. 3A, or the curl-preventing pattern CPA3 may be disposed on the first surface F1 to overlap the first and second non-bending areas NBA1 and NBA2 in the third direction DR3 similar to the embodiment illustrated in FIG. 3B.

In FIGS. 8, 9A, 9B, and 10, the display device DD' has one bending axis BX, but the number of the bending axes should not be limited to one. Thus, the above-mentioned features of the display device DD' may be applied to a display device having plural bending axes.

Figure 11A:
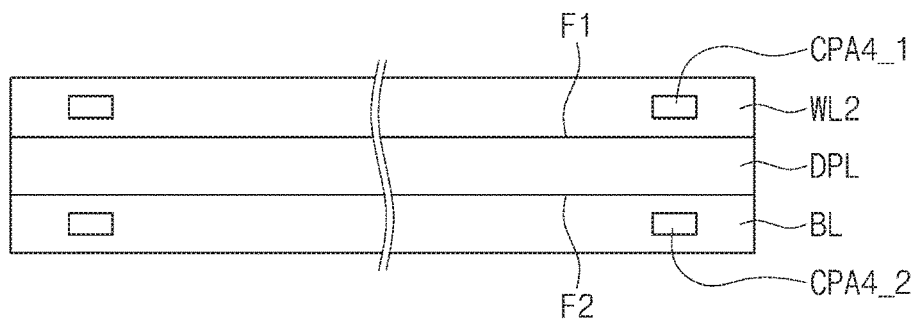
FIGS. 11A-11C are cross-sectional views of display devices according to exemplary embodiments of the present disclosure.
Figure 11B:
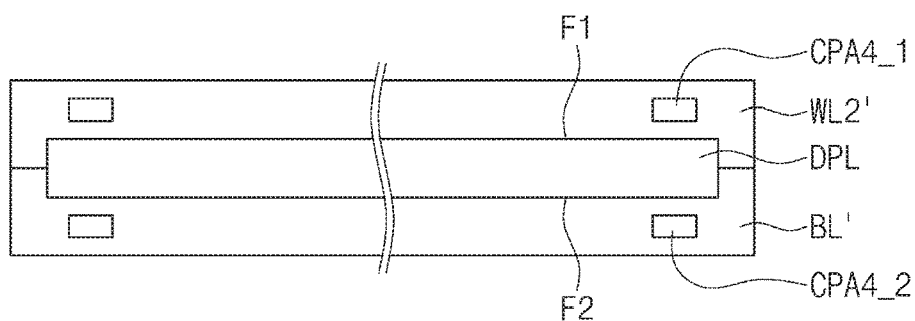
Figure 11C:
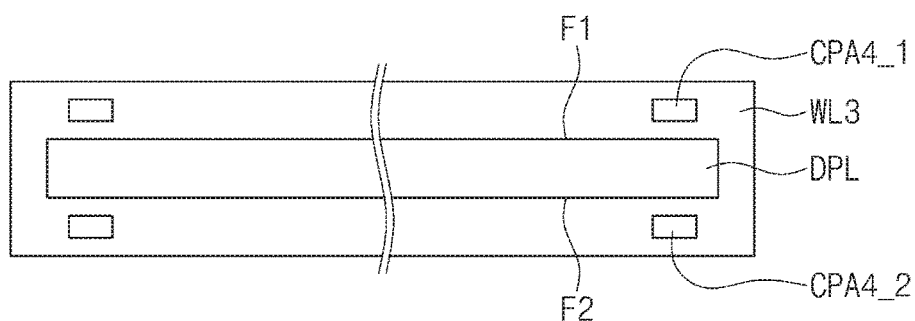
Figure 11D:
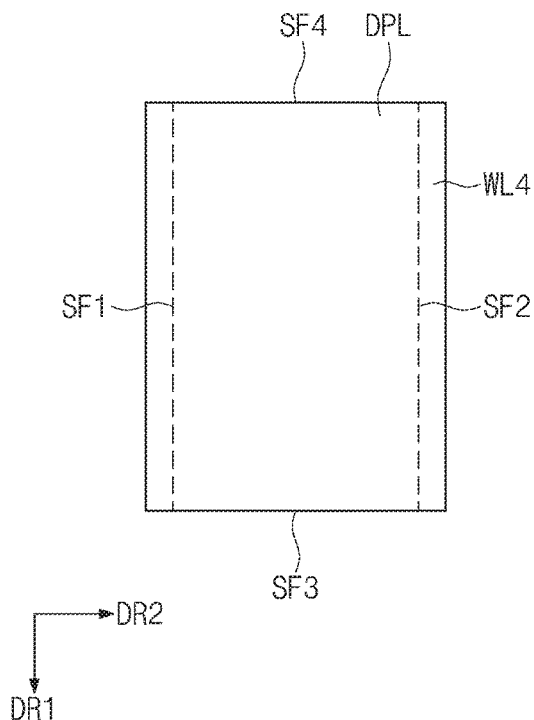
FIGS. 11D and 11E are plan views of display devices according to exemplary embodiments of the present disclosure.
Figure 11E:
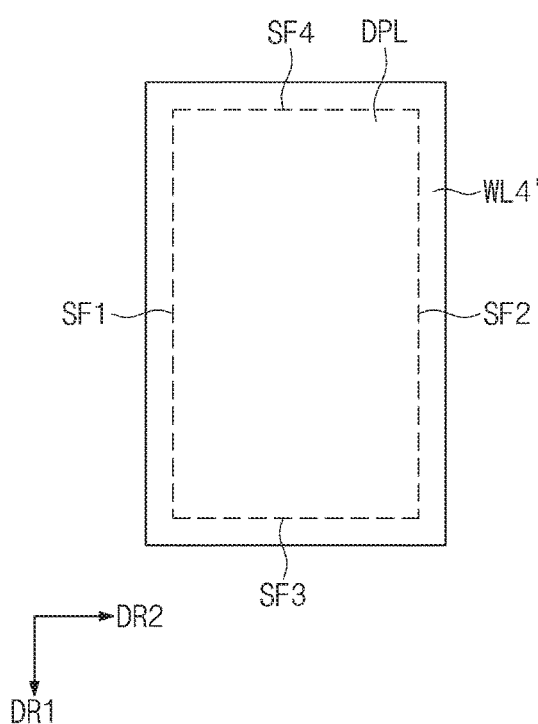

FIGS. 11A-11C are cross-sectional views of display devices according to exemplary embodiments of the present disclosure, and FIGS. 11D and 11E are plan views of display devices according to exemplary embodiments of the present disclosure.

Different from the display device shown in FIG. 2A, the display device shown in FIG. 11A may include a base coating layer BL instead of the base substrate PL.

Referring to FIG. 11A, the base coating layer BL is directly disposed on a lower surface of the display panel layer DPL. For example, the base coating layer BL is directly disposed on the second surface F2. In some embodiments, the base coating layer BL is directly disposed on the second surface F2 without using any adhesive members (e.g., PSA, OCR, OCA, or the like). The base coating layer BL may be disposed at an outermost position of the display device and may be exposed to the outside.

In the present exemplary embodiment, the base coating layer BL is formed by a coating or printing method. For instance, the base coating layer BL may be formed on the second surface F2 by a roll coating, silk screen coating, spray coating, or slit coating method without using an adhesive member. However, the method of coating the base coating layer BL on the second surface F2 should not be limited to the above-mentioned methods, and the base coating layer BL may be directly coated on the second coating layer BL through various suitable methods.

As described above, because the base coating layer BL, which is directly disposed on the second surface F2, is present instead of the base substrate PL, the display device may be slimmed, the display panel layer DPL may be protected, and the convenience of the manufacturing processes of the display device may be improved.

The display device includes a first curl-preventing pattern CPA4_1 and a second curl-preventing pattern CPA4_2. The first curl-preventing pattern CPA4_1 may be formed in the window coating layer WL2, and the second curl-preventing pattern CPA4_2 may be formed in the base coating layer BL. However, the first and second curl-preventing patterns CPA4_1 and CPA4_2 should not be limited thereto or thereby. For example, the first curl-preventing pattern CPA4_1 may be disposed on the first surface F1 or the upper surface of the window coating layer WL2, and the second curl-preventing pattern CPA4_2 may be disposed on the second surface F2 or the lower surface of the base coating layer BL. A substantially similar or the same structure may be applied to the display devices shown in FIGS. 11B and 11C. The other features and aspects of the first and second curl-preventing patterns CPA4_1 and CPA4_2 are the same or substantially the same as the other curl-preventing patterns as described above.

As shown in FIG. 11B, a window coating layer WL2' may be further disposed at a portion of a side surface of the display panel layer DPL (e.g., the window coating layer WL2' may extend onto the portion of the side surface of the display panel layer DPL) when compared with the window coating layer WL2 shown in FIG. 11A. For example, the window coating layer WL2' may be directly disposed on the first surface F1 and the portion of the side surface of the display panel layer DPL.

Similarly, a base coating layer BL' of the display device shown in FIG. 11B may be further disposed on the other portion (e.g., the remaining portion) of the side surface of the display panel layer DPL, on which the window coating layer WL2' is not disposed, when compared with the window coating layer WL2 shown in FIG. 11A. For example, the base coating layer BL' may be directly disposed on the second surface F2 and the other portion of the side surface of the display panel layer DPL, on which the window coating layer WL2' is not disposed.

When the window coating layer WL2' and the base coating layer BL' are disposed as shown in FIG. 11B, the display panel layer DPL may be more effectively protected.

The display device shown in FIG. 11C may include a window coating layer WL3 obtained by integrally forming the base coating layer BL' and the window coating layer WL2' shown in FIG. 11B. For example, the window coating layer WL2' and the base coating layer BL' may be integrally formed with each other.

For example, the window coating layer WL3 may be directly disposed on the first surface F1, the second surface F2, and the side surface of the display panel layer DPL.

When the window coating layer WL3 obtained by integrally forming the base coating layer BL' and the window coating layer WL2' is disposed in the above-mentioned manner and as shown in FIG. 11C, the display panel layer DPL may be more effectively protected.

FIGS. 11D and 11E show an arrangement of window coating layers WL4 and WL4' when viewed in a plan view.

Referring to FIG. 11D, the window coating layer WL4 may be directly disposed at a first side surface SF1 of the display panel and a second side surface SF2 opposite to the first side surface SF1 when viewed in a plan view. This arrangement of the window coating layer WL4 may be applied to the base coating layer (e.g., the base coating layer BL or BL') on a rear surface of the display panel.

As shown in FIG. 11E, the window coating layer WL4' may be directly disposed on all side surfaces (e.g., first to fourth side surfaces SF1-SF4) of the display panel layer DPL to more effectively protect the display panel layer DPL. For instance, the window coating layer WL4' may have a closed-loop shape when viewed in a plan view. This arrangement of the window coating layer WL4' may be applied to the base coating layer (e.g., the base coating layer BL or BL') on a rear surface of the display panel.

Figure 12A:
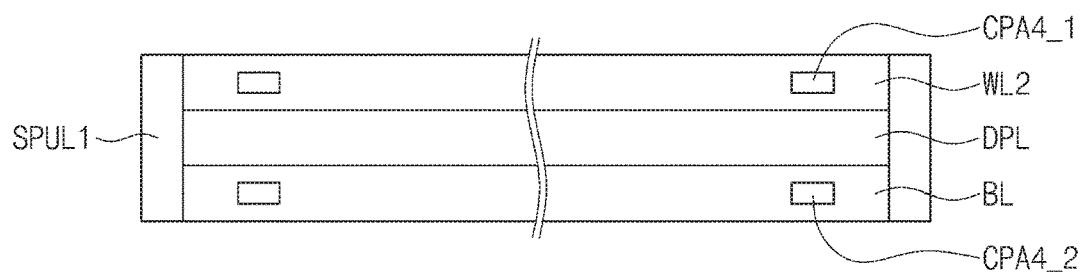
FIGS. 12A-12C are cross-sectional views of display devices according to exemplary embodiments of the present disclosure.
Figure 12B:
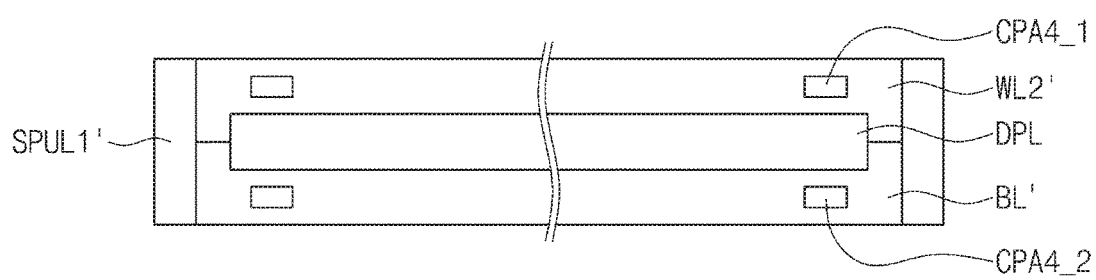
Figure 12C:
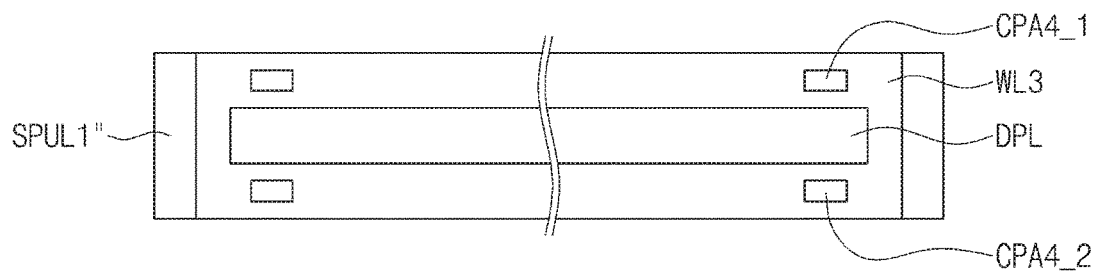

FIGS. 12A-12C are cross-sectional views of display devices according to exemplary embodiments of the present disclosure, and FIGS. 12D-12G are plan views of display devices according to exemplary embodiments of the present disclosure.

The display device shown in FIG. 12A may further include a protective layer SPUL1 when compared with the display device shown in FIG. 11A.

The protective layer SPUL1 may be disposed on side surfaces of the display panel layer DPL, the window coating layer WL2, and the base coating layer BL.

The protective layer SPUL1 includes an organic and/or inorganic material having a superior buffer function.

The protective layer SPUL1 is disposed at the side surface of the display device to protect (or prevent) an edge of the display device from being damaged when the base coating layer BL and the window coating layer WL2 are formed.

The display device shown in FIG. 12B may further include a protective layer SPUL1' when compared with the display device shown in FIG. 11B.

The protective layer SPUL1' may be disposed on side surfaces of the window coating layer WL2' and the base coating layer BL'. The other descriptions of the display device shown in FIG. 12B are the same or substantially the same as those of the display device shown in FIG. 12A, and thus, details thereof may be omitted.

The display device shown in FIG. 12C may further include a protective layer SPUL1" when compared with the display device shown in FIG. 11C.

The protective layer SPUL1" may be disposed on side surfaces of the window coating layer WL3. The other descriptions of the display device shown in FIG. 12C are the same or substantially the same as those of the display device shown in FIG. 12A, and thus, details thereof may be omitted.

Figure 12D:
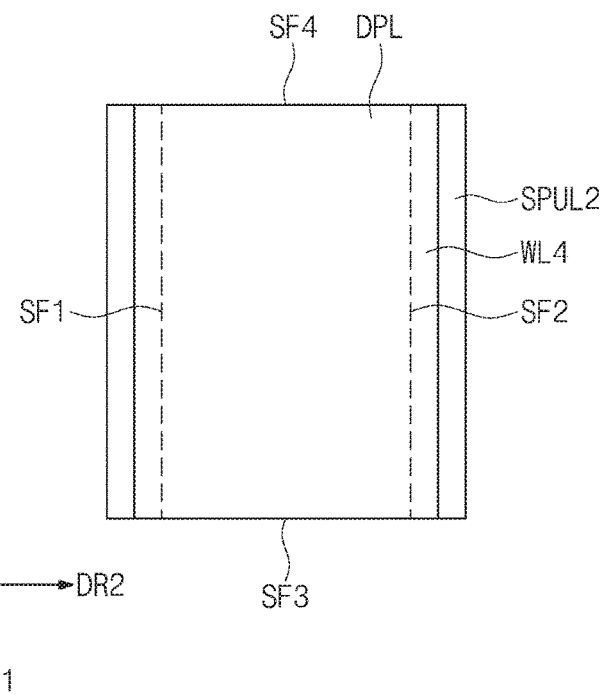
FIGS. 12D-12G are plan views of display devices according to exemplary embodiments of the present disclosure.
Figure 12E:
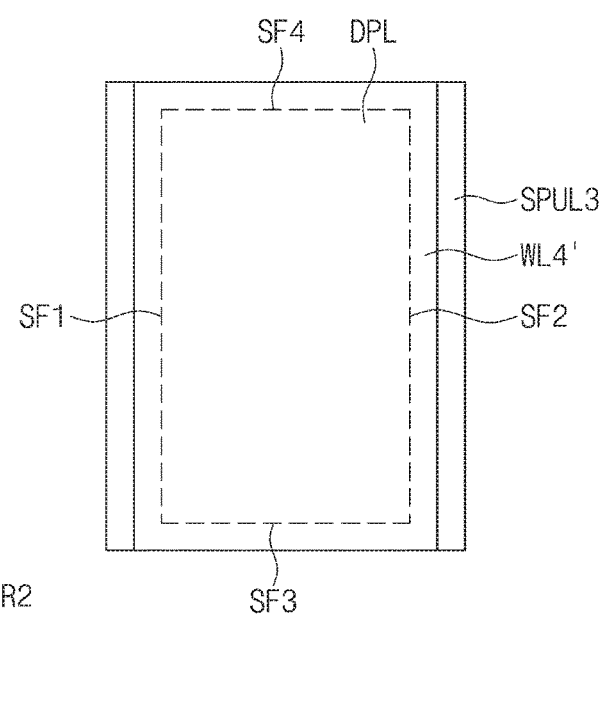
Figure 12F:
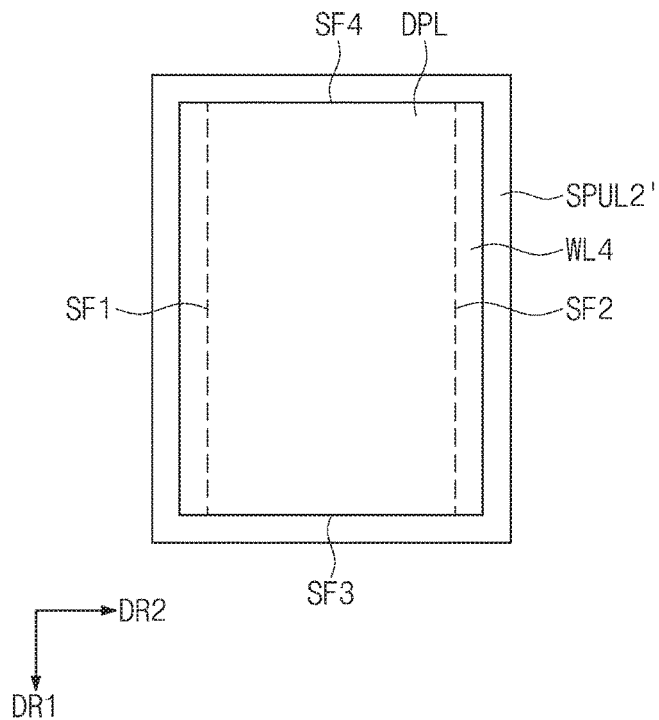

Display devices DD shown in FIGS. 12D and 12F may further include protective layers SPUL2 and SPUL2', respectively.

For instance, as shown in FIG. 12D, the protective layer SPUL2 may be disposed on side surfaces of the window coating layer WL4 which face each other in a direction substantially parallel to the second direction DR2 and may not be disposed on side surfaces of the window coating layer WL4 and the display panel layer DPL which face each other in a direction substantially parallel to the first direction DR1. As shown in FIG. 12F, the protective layer SPUL2' may be disposed on all side surfaces of the window coating layer WL4 and the display panel layer DPL, thereby more effectively protecting (or preventing) the edge of the display device from being damaged.

The arrangements of the protective layers SPUL2 and SPUL2' may be applied to the base coating layer (e.g., the base coating layer BL or BL'), but the arrangements of the protective layers SPUL2 and SPUL2' should not be limited thereto or thereby.

Figure 12G:
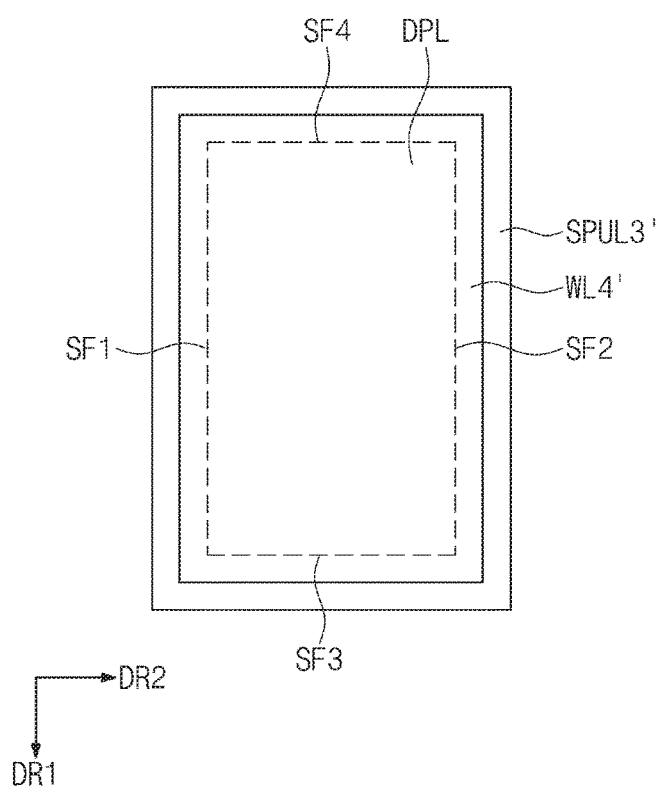

Display devices shown in FIGS. 12E and 12G may further include protective layers SPUL3 and SPUL3', respectively.

As shown in FIG. 12E, the protective layer SPUL3 may be disposed on side surfaces of the window coating layer WL4' when viewed in a plan view. For instance, the protective layer SPUL3 may be disposed on side surfaces of the window coating layer WL4' which face each other in a direction substantially parallel to the second direction DR2 and may not be disposed on side surfaces of the window coating layer WL4' which face each other in a direction substantially parallel to the first direction DR1. As shown in FIG. 12G, the protective layer SPUL3' may be disposed on all side surfaces of the window coating layer WL4', thereby more effectively protecting (or preventing) the edge of the display device from being damaged.

The arrangements of the protective layers SPUL3 and SPUL3' may be applied to the base coating layer (e.g., the base coating layer BL or BL'), but the arrangements of the protective layers SPUL3 and SPUL3' should not be limited thereto or thereby.

Figure 13:
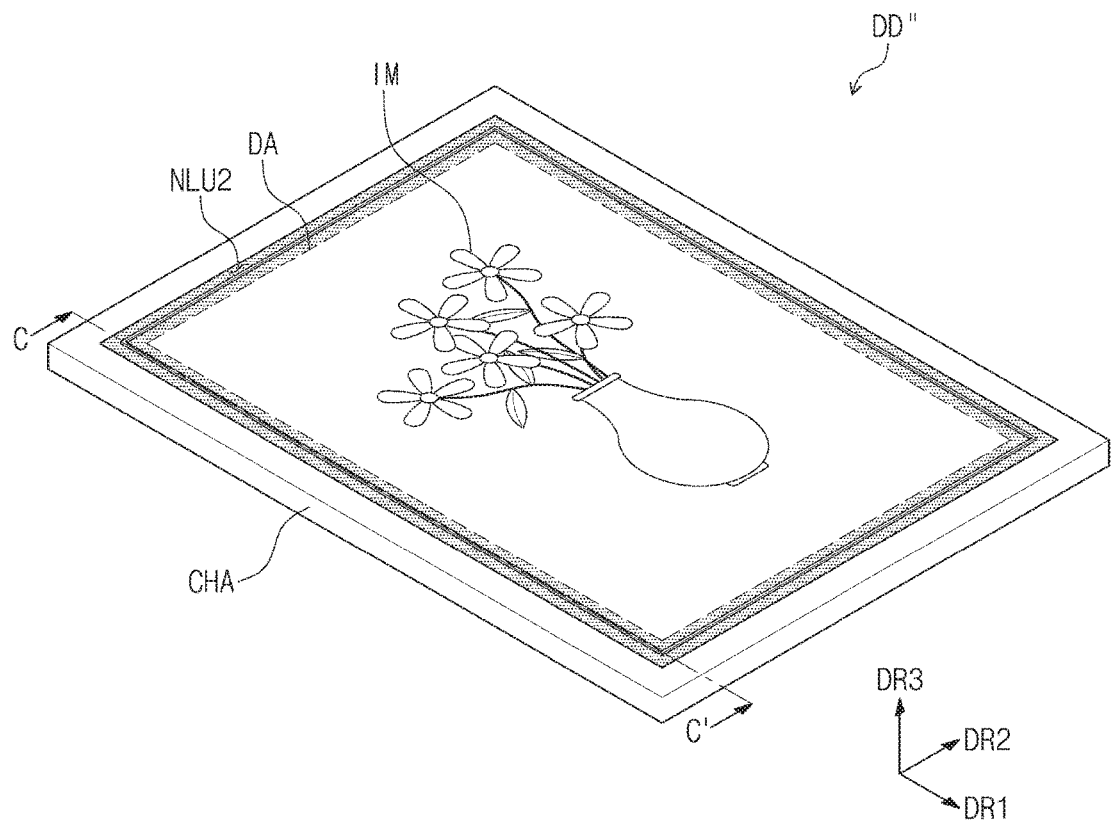
FIG. 13 is a perspective view of a display device according to another exemplary embodiment of the present disclosure.
Figure 14:
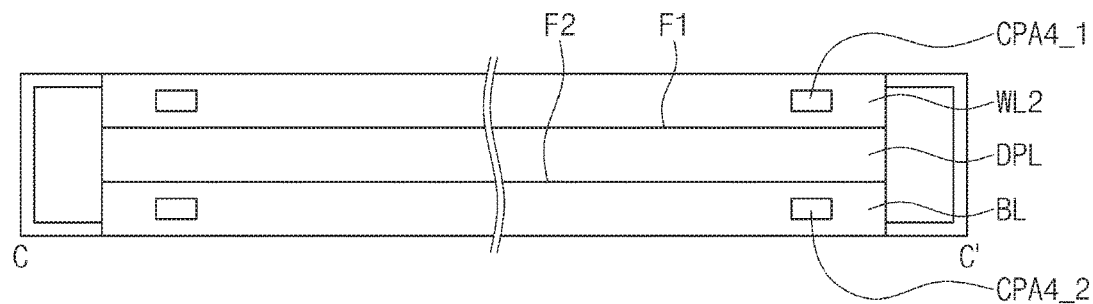
FIG. 14 is a cross-sectional view taken along the line C-C' of FIG. 13.

FIG. 13 is a perspective view of a display device according to another exemplary embodiment of the present disclosure, and FIG. 14 is a cross-sectional view taken along the line C-C' of FIG. 13.

The display device DD" shown in FIG. 13 may further include an accommodating chassis CHA when compared with the display devices shown in FIGS. 8 and 11A.

Referring to FIGS. 13 and 14, the accommodating chassis CHA is disposed at the side surface of the display device shown in FIG. 11A to surround the display device shown in FIG. 11A. Referring to FIG. 13, the accommodating chassis CHA has a closed-loop shape when viewed in a plan view.

An accommodating space is defined between at least one of the side surface of the window coating layer WL2, the side surface of the display panel layer DPL, and the side surface of the base coating layer BL and the accommodating chassis CHA. For instance, the accommodating space is defined between the accommodating chassis CHA and the side surface of the window coating layer WL2, the side surface of the display panel layer DPL, and the side surface of the base coating layer BL, and the accommodating space may be a closed space. Various parts or components, such as a battery, an universal subscriber identity module (USIM) chip, various circuit boards, etc., may be accommodated in the accommodating space (e.g., in the closed space).

However, the shape of the accommodating chassis CHA should not be limited to the above-mentioned shape, and further, the accommodating chassis CHA may be applied to any of the display devices described with reference to FIGS. 1-12E.

As described above, the display device DD" includes the accommodating chassis CHA, and thus, the display device DD" may be effectively made slimmer.

Although exemplary embodiments of the present invention have been described, it is understood that the present invention should not be limited to these exemplary embodiments and that various changes and modifications may be made thereto by one of ordinary skill in the art within the spirit and scope of the present invention according to the following claims and their equivalents.

What is claimed is:

1. A display device comprising:
   a display panel layer comprising a display area and a second non-light emitting area, the display area comprising a plurality of light emitting areas and a first non-light emitting area, the first non-light emitting area being around each of the light emitting areas, and the second non-light emitting area being outside the display area;
   a window coating layer directly coated on a first surface of the display panel layer; and
   a first curl-preventing pattern overlapping at least one of the first non-light emitting area and the second non-light emitting area when viewed in a plan view and contacting the window coating layer,
   wherein the first curl-preventing pattern is directly on the first surface of the display panel layer.

2. The display device of claim 1, wherein the second non-light emitting area extends around the display area when viewed in the plan view.

3. The display device of claim 2, wherein the first curl-preventing pattern has a closed-loop shape around the display area when viewed in the plan view.

4. The display device of claim 1, wherein the first curl-preventing pattern is entirely covered by the window coating layer.

5. A display device comprising:
   a display panel layer comprising a display area and a second non-light emitting area, the display area comprising a plurality of light emitting areas and a first non-light emitting area, the first non-light emitting area being around each of the light emitting areas, and the second non-light emitting area being outside the display area;
   a window coating layer coated on a first surface of the display panel layer; and
   a first curl-preventing pattern overlapping the first non-light emitting area when viewed in a plan view and contacting the window coating layer.

6. The display device of claim 5, wherein the first curl-preventing pattern has a lattice shape or a dot shape and is spaced from the light emitting areas when viewed in the plan view.

7. The display device of claim 6, wherein the first curl-preventing pattern also overlaps the second non-light emitting area.

8. The display device of claim 1, wherein the display device is configured to be bent with respect to a bending axis, and the first curl-preventing pattern does not overlap the bending axis.

9. The display device of claim 1, further comprising a base coating layer directly on a second surface of the display panel layer opposite the first surface of the display panel layer in a thickness direction of the display panel layer.

10. The display device of claim 9, further comprising a second curl-preventing pattern overlapping at least one of the first non-light emitting area and the second non-light emitting area when viewed in the plan view and contacting the base coating layer, the second curl-preventing pattern being configured to prevent the base coating layer from curling.

11. The display device of claim 10, wherein the second curl-preventing pattern is on the second surface of the display panel layer.

12. The display device of claim 10, wherein the second curl-preventing pattern is in the base coating layer.

13. The display device of claim 9, wherein the window coating layer extends onto a side surface of the display panel layer, and the base coating layer extends onto the side surface of the display panel layer and contacts the window coating layer.

14. The display device of claim 9, wherein the window coating layer is integrally formed with the base coating layer.

15. The display device of claim 9, further comprising a protective layer on at least one of a side surface of the display panel layer, a side surface of the window coating layer, and a side surface of the base coating layer.

16. The display device of claim 9, further comprising an accommodating chassis accommodating components configured to drive the display panel layer,
   wherein an accommodating space is defined between the accommodating chassis and at least one of a side surface of the display panel layer, a side surface of the window coating layer, and a side surface of the base coating layer, and
   wherein the components are accommodated in the accommodating space.

17. The display device of claim 1, wherein the first curl-preventing pattern has an elastic modulus greater than an elastic modulus of the window coating layer.

18. The display device of claim 1, wherein the display panel layer further comprises:
   a pixel layer to display an image;
   a touch layer on the pixel layer and configured to sense a touch applied thereto; and
   a reflection-preventing layer on the pixel layer and configured to prevent external light from being reflected therefrom,
   wherein one of the touch layer and the reflection-preventing layer is an outermost layer of the display panel layer, and
   wherein the window coating layer is directly on an outer surface of the one of the touch layer and the reflection-preventing layer that is the outermost layer of the display panel layer.

19. A display device comprising:
   a display panel layer comprising a pixel layer to display an image, a touch layer on the pixel layer and configured to sense a touch applied thereto, and a reflection-preventing layer on the pixel layer and configured to prevent external light from being reflected therefrom, one of the touch layer and the reflection-preventing layer being an outermost layer of the display panel layer;

a window coating layer directly on an outer surface of the one of the touch layer and the reflection-preventing layer that is an outermost surface of the display panel layer; and a curl-preventing pattern contacting the window coating layer, the curl-preventing pattern being configured to prevent the window coating layer from curling.

20. A display device comprising:

a display panel layer having a display area and a non-display area around the display area, the display panel layer comprising a plurality of organic light emitting diodes in the display area;

a window coating layer on the display panel layer; and a curl-preventing pattern on the display panel layer in the display area between adjacent ones of the organic light emitting diodes, the curl-preventing pattern having a greater elastic modulus than the window coating layer.

21. The display device of claim 20, wherein the curl-preventing pattern is also on the display panel layer in the non-display area.

22. The display device of claim 21, further comprising a black matrix on the display panel layer in the non-display area, wherein the curl-preventing pattern is on the black matrix and under the window coating layer.

23. The display device of claim 20, wherein the curl-preventing pattern comprises a plurality of sub-curl preventing patterns, and wherein a first one of the sub-curl preventing patterns extends from one edge of the display panel layer toward a center thereof, and a second one of the sub-curl preventing patterns extends from another edge of the display panel layer opposite the one edge of the display panel layer, the first and second ones of the sub-curl preventing patterns being spaced from each other.

24. The display device of claim 23, wherein the display device is configured to be bent at an area between the first and second ones of the sub-curl preventing patterns.

\* \* \* \* \*